US012751313B2

(12) United States Patent
Fountain, Jr. et al.

(10) Patent No.: US 12,751,313 B2
(45) Date of Patent: Sep. 29, 2026

(54) SELECTIVE ALTERATION OF INTERCONNECT PADS FOR DIRECT BONDING

(71) Applicant: ADEIA SEMICONDUCTOR BONDING TECHNOLOGIES INC., San Jose, CA (US)

(72) Inventors: Gaius Gillman Fountain, Jr., Youngsville, NC (US); Javier A. DeLaCruz, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 777 days.

(21) Appl. No.: 17/168,034

(22) Filed: Feb. 4, 2021

(65) Prior Publication Data

US 2021/0242152 A1 Aug. 5, 2021

Related U.S. Application Data

(60) Provisional application No. 62/970,458, filed on Feb. 5, 2020.

(51) Int. Cl.
*H10W 72/90* (2026.01)
*H10W 99/00* (2026.01)
(Continued)

(52) U.S. Cl.
CPC ....... *H10W 72/9445* (2026.01); *H10W 99/00* (2026.01); *H10W 80/023* (2026.01); (Continued)

(58) Field of Classification Search
CPC . H01L 2224/05695; H01L 2224/06163; H01L 2224/06164; H01L 2224/09133; (Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2012-033878 A 2/2012
JP 2013-033786 A 2/2013
(Continued)

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
(Continued)

*Primary Examiner* — Daniel Luke
(74) *Attorney, Agent, or Firm* — Knobbe, Martens, Olson & Bear, LLP

(57) ABSTRACT

A bonded structure and a method of forming such a bonded structure are disclosed. The bonded structure can include a first element and a second element. The first element has a first bonding surface including a first nonconductive material and a plurality of first contact pads. The first contact pads are electrically connected to one or more first microelectronic devices in the first element. The second element has a second bonding surface including a second nonconductive material and a plurality of second contact pads. The second contact pads are electrically connected to one or more second microelectronic devices in the second element. The second bonding surface is directly bonded to the first bonding surface without an intervening adhesive to form a bonding interface, and one or more first contact pads is omitted from the first microelectronic element to alter the functionality of the bonded structure.

21 Claims, 17 Drawing Sheets

(51) Int. Cl.
*H10W 80/00* (2026.01)
*H10W 90/00* (2026.01)

(52) U.S. Cl.
CPC ........ *H10W 80/033* (2026.01); *H10W 80/312* (2026.01); *H10W 80/327* (2026.01); *H10W 90/792* (2026.01)

(58) Field of Classification Search
CPC ........... H01L 2224/80895; H01L 2224/80896; H10W 72/9445
See application file for complete search history.

(56) References Cited

U.S. PATENT DOCUMENTS 6,080,640 A 6/2000 Gardner et al.
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,692,136 B2 4/2014 Oh et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,236,335 B2 1/2016 Ishikawa
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 * 5/2016 Chen ................ H01L 27/14643
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,727,219 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,056,348 B2 7/2021 Theil
11,088,099 B2 8/2021 Katkar et al.
11,127,738 B2 9/2021 DeLaCruz et al.
11,158,606 B2 10/2021 Gao et al.
11,171,117 B2 11/2021 Gao et al.
11,176,450 B2 11/2021 Teig et al.
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,387,202 B2 7/2022 Haba et al.
11,515,291 B2 11/2022 DeLaCruz et al.
11,631,647 B2 4/2023 Haba
11,735,523 B2 8/2023 Uzoh
11,749,645 B2 9/2023 Gao et al.
2004/0084414 A1 5/2004 Sakai et al.
2006/0057945 A1 3/2006 Hsu et al.
2007/0111386 A1 5/2007 Kim et al.
2013/0105924 A1 * 5/2013 Kobayashi .............. H01L 31/18
438/69
2014/0175655 A1 6/2014 Chen et al.
2015/0064498 A1 3/2015 Tong
2016/0043060 A1 2/2016 Kabe et al.
2016/0343682 A1 11/2016 Kawasaki
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2019/0096741 A1 3/2019 Uzoh et al.
2019/0115277 A1 4/2019 Yu et al.
2019/0131277 A1 5/2019 Yang et al.
2019/0198409 A1 6/2019 Katkar et al.
2019/0265411 A1 8/2019 Huang et al.

(56) References Cited

U.S. PATENT DOCUMENTS

2019/0333550 A1 10/2019 Fisch
2019/0355706 A1 11/2019 Enquist et al.
2019/0385963 A1 12/2019 Chen et al.
2019/0385966 A1 12/2019 Gao et al.
2020/0013637 A1 1/2020 Haba
2020/0013765 A1 1/2020 Fountain, Jr. et al.
2020/0035641 A1 1/2020 Fountain, Jr. et al.
2020/0075534 A1 3/2020 Gao et al.
2020/0118973 A1 4/2020 Wang et al.
2020/0126906 A1 4/2020 Uzoh et al.
2020/0194396 A1 6/2020 Uzoh
2020/0227367 A1 7/2020 Haba et al.
2020/0294908 A1 9/2020 Haba et al.
2020/0328162 A1 10/2020 Haba et al.
2020/0328164 A1 10/2020 DeLaCruz et al.
2020/0328165 A1 10/2020 DeLaCruz et al.
2020/0371154 A1 11/2020 DeLaCruz et al.
2020/0395321 A1 12/2020 Katkar et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0296282 A1 9/2021 Gao et al.
2021/0305202 A1 9/2021 Uzoh et al.
2021/0366820 A1 11/2021 Uzoh
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.
2024/0332184 A1 10/2024 Katkar et al.
2024/0332227 A1 10/2024 Uzoh et al.
2024/0332231 A1 10/2024 Uzoh
2024/0332267 A1 10/2024 Haba et al.
2024/0387419 A1 11/2024 Mrozek et al.
2025/0004197 A1 1/2025 Haba et al.
2025/0006632 A1 1/2025 Chang et al.
2025/0006642 A1 1/2025 Haba et al.
2025/0006674 A1 1/2025 Uzoh et al.
2025/0006679 A1 1/2025 Theil et al.
2025/0006689 A1 1/2025 Uzoh et al.
2025/0054854 A1 2/2025 Katkar et al.
2025/0079364 A1 3/2025 Uzoh et al.
2025/0096191 A1 3/2025 Gao et al.
2025/0112123 A1 4/2025 Katkar et al.

FOREIGN PATENT DOCUMENTS

JP 2013120838 A 6/2013
JP 2018-160519 10/2018
WO WO 2005/043584 A2 5/2005
WO WO 2021/158881 A1 8/2021

OTHER PUBLICATIONS

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion mailed May 18, 2021, for International Appl. No. PCT/US2021/016759, 6 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article");

(56) References Cited

OTHER PUBLICATIONS however, the imaged part and the part shown in the BUSH article share the part number "ONSEMI AR0820."

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

* cited by examiner

SELECTIVE ALTERATION OF INTERCONNECT PADS FOR DIRECT BONDING

INCORPORATION BY REFERENCE TO ANY PRIORITY APPLICATIONS

This application claims priority to U.S. Provisional Patent Application No. 62/970,458, filed Feb. 5, 2020, the entire contents of which are hereby incorporated by reference in their entirety and for all purposes.

BACKGROUND

Field of the Invention

The field relates to bonded semiconductor elements and methods for forming the same.

Description of the Related Art

Semiconductor elements, such as integrated device dies, can be stacked on top of one another to perform a particular functionality. For example, respective contact pads of two integrated device dies can be electrically connected to one another by solder balls. The contact pads can connect to active circuitry within the respective integrated device dies. In each of the integrated device dies, the contact pads can be arranged to make electrical connections between selected active circuits in the dies so as to perform a particular functionality. Thus, in stacked and electrically connected structures, the connections between contact pads can enable a desired functionality of the electronic device.

SUMMARY

A bonded structure is disclosed. In one embodiment, the bonded structure includes: a first element having a first bonding surface including a first nonconductive material and a plurality of first contact pads, the first contact pads electrically connected to one or more first microelectronic devices in the first element; and a second element having a second bonding surface including a second nonconductive material and a plurality of second contact pads, the second contact pads electrically connected to one or more second microelectronic devices in the second element, wherein the second bonding surface is directly bonded to the first bonding surface without an intervening adhesive to form a bonding interface, and wherein one or more first contact pads is omitted from the first microelectronic element to alter the functionality of the bonded structure.

In some embodiments, the bonded structure further includes an omitted contact pad region from which the one or more first contact pads is omitted and a trace extending between at least one first microelectronic device and the omitted contact pad region. In some embodiments, the omitted contact pad region includes one or more voids in the first nonconductive material. In some embodiments, the omitted contact pad region includes a solid nonconductive filler material disposed in the one or more voids, an interface disposed between the solid nonconductive filler material and the first nonconductive material. In some embodiments, the omitted contact pad region includes a fully-omitted contact pad region devoid of a contact pad. In some embodiments, the first nonconductive material extends continuously within the omitted contact pad region. In some embodiments, the omitted contact pad region includes a partially-omitted contact pad region including a remaining portion of the omitted contact pad and a void above the remaining portion. In some embodiments, the bonded structure further includes a solid nonconductive filling material in the void. In some embodiments, the plurality of first contact pads is directly bonded to the second plurality of second contact pads, the bonded structure including a plurality of traces extending between a plurality of first microelectronic devices and the plurality of first contact pads. In some embodiments, the trace has a terminating end that terminates at the omitted contact pad region. In some embodiments, the first element includes a bulk semiconductor portion and a die bond pad formed in or on the semiconductor portion, the first nonconductive material disposed on the bulk semiconductor portion, the terminating end of the trace including the die bond pad of the first element. In some embodiments, the first element includes a bulk semiconductor portion, the first nonconductive material disposed on the bulk semiconductor portion, the terminating end of the trace extending into the first nonconductive material. In some embodiments, the bonded structure further includes redistribution metallization extending laterally in the first nonconductive material, the terminating end of the trace including an end of the redistribution metallization. In some embodiments, the trace is connected to electrical ground. In some embodiments, one or more second contact pads is omitted from the second microelectronic element, the one or more omitted second contact pads aligned with the one or more omitted first contact pads. In some embodiments, the plurality of first contact pads is arranged in a regular pattern but for the one or more omitted first contact pads, as seen from a bottom plan view. In some embodiments, the omitted contact pad region includes a barrier layer disposed in the first nonconductive material, a rounded or angled surface of the first nonconductive material extending between the barrier layer and the bonding interface.

In another embodiment, the bonded structure includes: a first element having a first bonding surface including a first nonconductive material and a plurality of first contact pads, the first contact pads electrically connected to one or more first microelectronic devices in the first element by way of one or more first traces; and a second element having a second bonding surface including a second nonconductive material and a plurality of second contact pads, the second contact pads electrically connected to one or more second microelectronic devices in the second element by way of one or more second traces, wherein the second bonding surface is directly bonded to the first bonding surface without an intervening adhesive to form a bonding interface, and wherein at least one first trace extends between at least one first microelectronic device and an omitted contact pad region at the bonding interface.

In some embodiments, the omitted contact pad region includes one or more voids in the first nonconductive material. In some embodiments, the omitted contact pad region includes a solid nonconductive filler material disposed in the one or more voids, an interface disposed between the solid nonconductive filler material and the first nonconductive material. In some embodiments, the omitted contact pad region includes a fully-omitted contact pad region devoid of a contact pad. In some embodiments, the first nonconductive material extends continuously within the omitted contact pad region.

Furthermore, a method of forming a bonded structure is disclosed. In one embodiment, the method includes: directly bonding a first bonding material of a first element to a second nonconductive material of a second element without an intervening adhesive to form a bonding interface; directly contacting a plurality of first contact pads of the first element to a plurality of second contact pads of the second element, the first conductive contact pads electrically connected to one or more first microelectronic devices in the first element, the second contact pads electrically connected to one or more second microelectronic devices in the second element; and omitting one or more first contact pads from the first microelectronic element to alter the functionality of the bonded structure.

In some embodiments, omitting the one or more first contact pads includes forming the one or more first contact pads and at least partially removing the one or more first contact pads before the directly bonding. In some embodiments, at least partially removing includes completely removing the one or more first contact pads. In some embodiments, at least partially removing includes partially removing the one or more first contact pads. In some embodiments, the method further includes providing a solid filling material in a void formed by the at least partially removing. In some embodiments, omitting the one or more first contact pads includes selectively forming the plurality of first contact pads to omit the one or more first contact pads to alter the functionality of the bonded first and second elements. In some embodiments, directly bonding includes directly bonding a first wafer including the first element to a second wafer including the second element. In some embodiments, directly bonding includes directly bonding a first die including the first element to a second die including the second element. In some embodiments, directly bonding includes directly bonding a die including the first element to a wafer including the second element. In some embodiments, the method further includes removing a barrier layer at an omitted contact pad region in which the one or more first contact pads has been omitted. In some embodiments, removing the barrier layer includes forming a rounded or angled surface in the first nonconductive material between the barrier layer and the bonding interface. In some embodiments, the one or more omitted first contact pads are changed based upon test data.

In yet another embodiment, the bonded structure includes a bonding surface having a plurality of wafer testing pad locations, wherein all or a portion of metallization of the wafer testing pad locations is removed to recess the portion from the bonding surface. In some embodiments, the bonding surface includes a nonconductive material, the portion of metallization of the wafer testing pad locations being recessed from an upper surface of the nonconductive material.

BRIEF DESCRIPTION OF THE DRAWINGS

Specific implementations will now be described with reference to the following drawings, which are provided by way of example, and not limitation.

DETAILED DESCRIPTION

Microelectronic devices, such as active circuits, on semiconductor elements can be capable of many different functionalities, depending on which components of the circuitries are enabled. As explained herein, two or more elements (such as semiconductor elements) can be directly bonded and stacked to one another without an intervening adhesive. For example, respective nonconductive bonding surfaces of the elements can be directly bonded together without an adhesive. Corresponding conductive contact pads may also be directly bonded together without an adhesive to provide electrical communication between the two elements. The two bonded elements can communicate with one another by way of the contact pads to perform one or multiple functions. In conventional applications, if a different functionality is desired for the bonded structure, the implementation of such different functionalities often uses new tape-outs for one or both of the semiconductor elements to be bonded, e.g., new designs for the circuit layouts and buildup of the semiconductor elements, which can cost a significant amount in resources and time. Each tape-out or fabrication of an integrated circuit die (e.g., a semiconductor chip) is an expensive and time-consuming process.

Accordingly, it can be beneficial to implement different functionalities in bonded structures, or to repair errors or deficiencies in bonded structures (or the individual elements) without having to complete an entirely new tape-out for each element, particularly when a similar or same chip can be utilized with different components and/or different electrical connections enabled. In various embodiments disclosed herein, the adjustment of interconnections between opposing contact pads in bonded structures can enable the assembler or manufacture to achieve different functionality and/or to repair errors in the bonded structure or individual elements.

Figure 1:
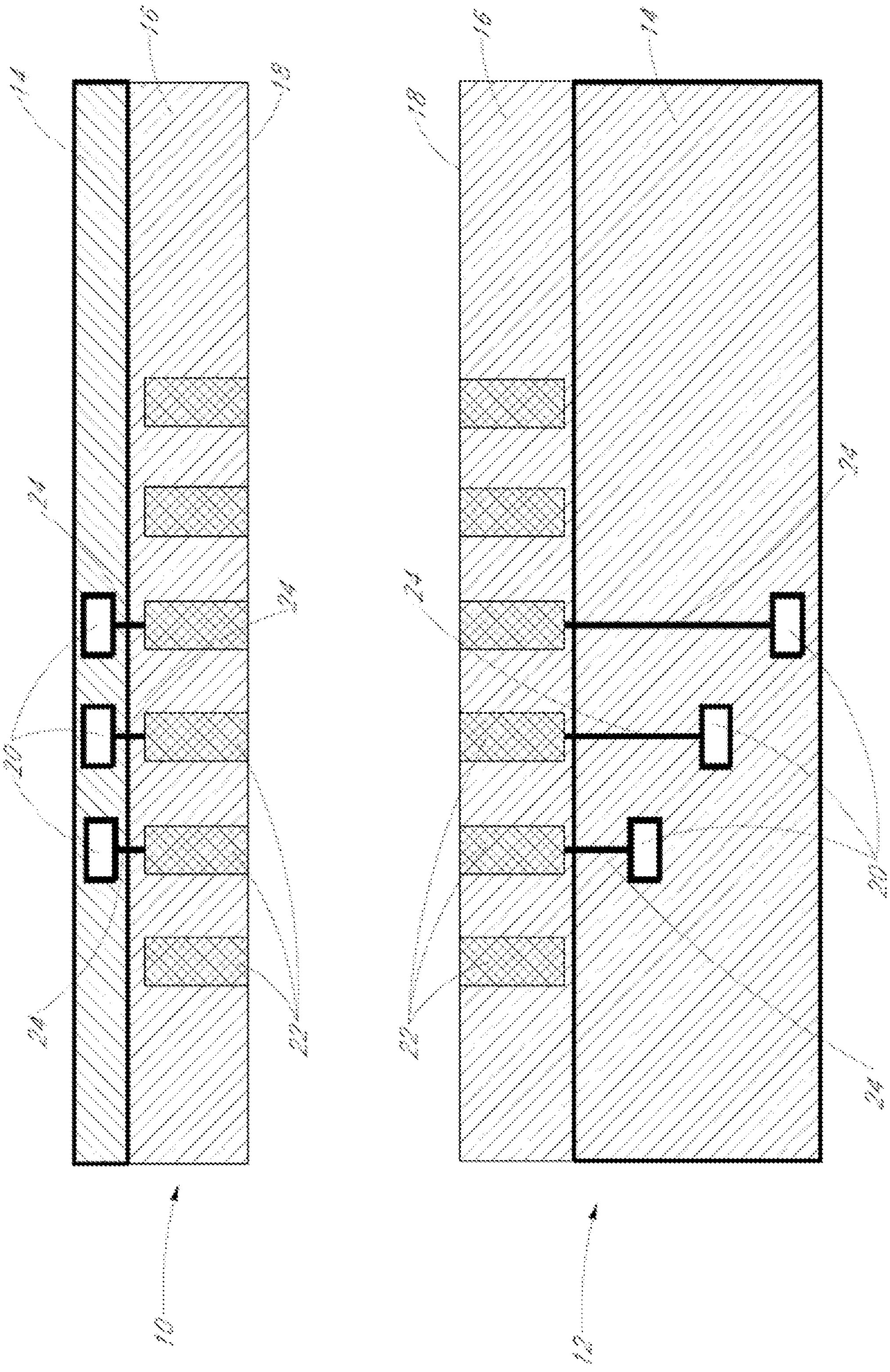
FIG. 1 is a schematic side sectional view of semiconductor elements that are to be directly bonded to one another without an intervening adhesive.

FIG. 1 is a schematic side sectional view of a first element 10 and a second element 12 (which can comprise semiconductor elements) that are to be directly bonded. Each of the first element 10 and the second element 12 includes a device portion 14 (e.g., a bulk semiconductor portion), a nonconductive bonding layer 16 provided over the device portion 14 that defines a bonding surface 18, a plurality of microelectronic devices comprising integrated devices or circuits 20 (which can include active devices (e.g., transistors, logic devices, etc.) and/or passive devices (e.g., capacitors, etc.)), a plurality of conductive contact pads 22 exposed at (e.g., recessed relative to, or flush with) the bonding surface 18, and a plurality of traces 24 which connect the respective integrated circuits 20 to corresponding conductive contact pads 22. Each of the first element 10 and/or the second element 12 can be in wafer form in some embodiments, e.g., a wafer, a reconstituted wafer, an interposer, etc. In other embodiments, the first element 10 and/or the second element 12 can comprise singulated elements, e.g., an integrated device die (such as a processor die, microelectromechanical systems (MEMS) die, a sensor die, a memory die, etc.), a reconstituted die, a singulated interposer element, etc. In some embodiments, the first element 10 can be in wafer form, and the second element 12 can be singulated (e.g., in die form), or vice versa. The device portion 14 can comprise, e.g., a bulk semiconductor portion, such as silicon. Furthermore, the device portion 14 can also comprise, e.g., one or multiple patterned device layer, which can include a number of integrated circuit layers with logic gates, local interconnects, and other devices such as capacitors. In addition, although not shown, the device portion 14 can further comprise metallization layers (such as back-end-of-line (BEOL)) to provide routing at the upper surfaces. The bonding layer 16 and pads 22 can be provided over the device portion 14, including over any metallization or BEOL layers on the upper surface of the device portion 14.

Figure 2:
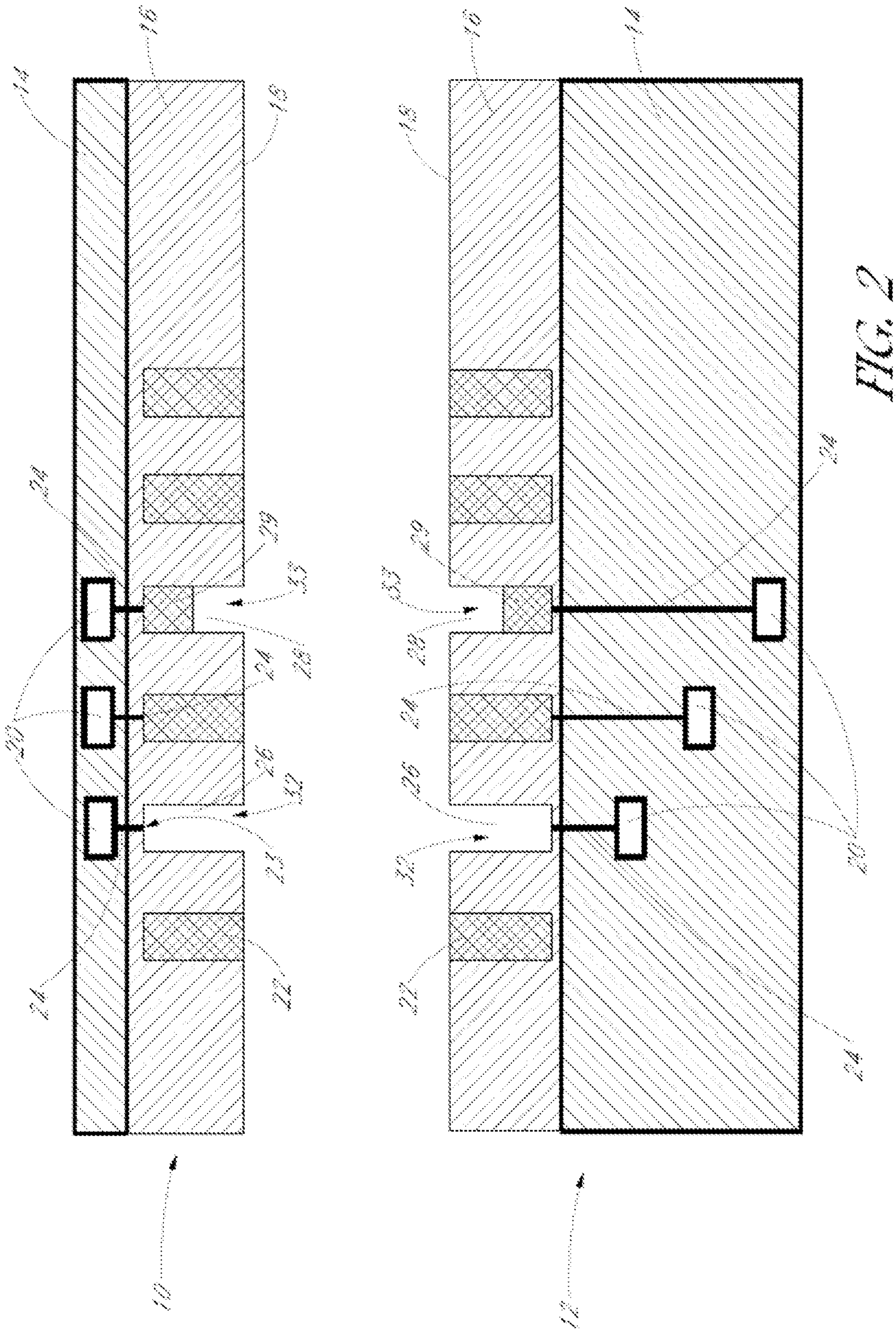
FIG. 2 is a schematic side sectional view of semiconductor elements that include altered or omitted contact pads before being directly bonded to one another, according to an embodiment.

As shown, the microelectronic devices can comprise integrated circuits 20, which can be disposed within the device portion 14, and can comprise various electronic components, e.g., transistors and other types of circuit elements. The integrated circuits 20 shown in FIG. 2 are examples of microelectronic devices that can be provided in the device portion 14. The integrated circuits 20 are shown in a highly schematic block illustration, but skilled artisans would understand that the integrated circuits 20 can be patterned within the interior of the device portion 14, at the surface of the device portion 14, or any other suitable location. One or more conductive traces 24 can electrically connect integrated circuits 20 with corresponding conductive contact pads 22 that can be configured to electrically connect to (e.g., directly bond to) corresponding contact pads on another element. In various embodiments, the traces 24 can terminate at die bond pads (not shown) of the element 10, 12 (e.g., a die), which can communicate with the contact pads 22 within the bonding layer 16. In some embodiments, the contact pads 22 of the bonding layer 16 are deposited directly onto the die bond pads of the elements 10, 12. In other embodiments, additional conductive material can be provided in the bonding layer 16 to extend the traces 24 laterally and/or vertically to connect to the contact pads 22. For example, in some embodiments, the traces 24 can be part of redistribution metallization of a redistribution layer (RDL) (not shown) that is routed laterally relative to the device portion 14 from die bond pads to the contact pads 22. The traces 24 are shown in a highly schematic manner in the figures as extending into the bonding layer 16 (e.g., as part of additional routing in the bonding layer or as a bond pad extension), but it should appreciated that the traces 24 can terminate at die bond pads (e.g., die bond pads 50 in FIG. 6D) at the surface of the device portion 14.

After direct bonding, the contact pads 22 of the first element 10 can be electrically connected to the contact pads of the second element 12 so as to form electrical connections between integrated circuits 20 on the first element 10 and integrated circuits 20 on the second element 12. The direct bonding between the elements 10, 12 can comprise direct bonding, as described in detail herein. It should be appreciated that the elements 10, 12 of FIG. 1 are illustrated schematically and that the relative proportions of the various structure features may be exaggerated for ease of illustration. Furthermore, FIG. 1 may illustrate only a subset of the integrated circuits 20; indeed, additional integrated circuits 20 can be provided and electrically connected to the contact pads 22.

The nonconductive bonding layer can comprise one or multiple dielectric layers, in various embodiments. For example, the nonconductive layer(s) can comprise a silicon oxide layer, a silicon nitride layer, a silicon oxynitride layer, a silicon carbonitride layer, or any other suitable nonconductive material. The contact pads 22 can comprise any suitable type of electrical conductor, such as a metal, e.g., copper. Likewise, the traces 24 can comprise a suitable conductor, such as copper. In some embodiments, a single nonconductive layer 16 is provided. In other embodiments, multiple nonconductive layers 16 (and multiple layers of vertical and/or lateral metallization) can be provided (e.g., deposited or plated) within the multiple layers 16.

Various embodiments disclosed herein relate to a bonded structure 1 (shown in, e.g., FIGS. 3A-3D and 6A-6D). As explained above, the first element 10 and the second element 12 may be fabricated in wafers having devices configured to perform various functionalities. For example, in FIG. 1, the nonconductive bonding layer 16 can be deposited over the device portion 14 and patterned to expose openings in which the conductive material for the contact pads 22 (and/or extensions of the traces 24 or other routing metallization) is to be deposited. The nonconductive bonding layers 16 can be prepared for direct bonding as described below, and the two elements 10, 12 (including both the nonconductive layers 16 and the contact pads 22) can be directly bonded to one another without an intervening adhesive. In FIG. 1, every integrated circuit 20 that is designed to connect to a contact pad 22 is connected to that contact pad 22 by way of one or more traces 24. As used herein, the traces 24 can directly electrically connect the contact pads 22 to the integrated circuits 20, or can be indirectly electrically connect the contact pads 22 to the integrated circuits 20 by way of intervening die bond pads and/or additional routing metallization in the bonding layer 16 and/or other layers provided on the elements 10, 12. Thus, after bonding, the structure of FIG. 1 includes electrical connections between the integrated circuits 20 and the contact pads 22, and the traces 24 connect the pads 22 and the integrated circuits 20 based upon the original circuit design for the elements 10, 12 and the bonded structure.

In FIG. 1, therefore, the layout of the integrated circuits 20, corresponding contact pads 22, and corresponding connecting traces 24 is designed to perform a particular function. In some embodiments, it may be desirable to modify the functionality of the bonded structure without having to redesign the individual elements 10, 12. In some embodiments, it may be desirable to fix errors or address deficiencies in one or more elements 10, 12 or the bonded structure. In various embodiments, for example, the bonding layer(s) of chips that are similar or identical to those in FIG. 1 may be altered in order to affect the performance of the bonded structure 1, or to adjust settings for a given microelectronic device within the chip in the bonded structure 1. For example, the contact pad design for one or both elements 10, 12 can be altered so as to modify the functionality of the bonded structure. Beneficially, such modification allows a manufacturer to provide custom bonded products using the same underlying chips without having to conduct new tape-outs for the individual elements 10, 12. This further enables the manufacturer to more easily customize products for different markets with the same or similar chips while controlling price point, functionality, frequency/frequency range (which may reduce power and errors), etc.

In the embodiments disclosed herein, for the formation and/or alteration of the bonding layers 16 and pads 22, the exposure of photoresist can be performed at a wafer level by utilizing a mask and lithographic techniques to expose and pattern the regions for the contact pads 22. Alternatively, the bonding layers 16 and pads 22 can be patterned with a method that enables higher flexibility such as, e.g., direct laser writing to actively remove interconnects, or to expose a resist to selectively etch interconnect locations. A laser writing process may leverage test information for wafer sort or from process monitoring data.

The test interconnect pad locations that were used for wafer sort can also have their probe marks removed by selectively etching those locations. The probe mark may make the topology of the mark exceed the bonding interface, thus limiting the bonding of the surfaces. Removing this material would prevent the material from exceeding the height that would inhibit bonding. Thus, in some embodiments, a bonding surface can have a plurality of wafer testing pad locations. All or a portion of metallization of the wafer testing pad locations can be removed to recess the portion from the bonding surface, such that the portion of metallization of the wafer testing pad locations can be recessed from an upper surface of the nonconductive material, so as to disable interconnections in these locations when the elements 10, 12 are bonded together. This recess can be accomplished by patterning with photoresist and etching the metal (e.g., copper) selectively out of the openings at these locations.

FIG. 2 is a schematic side sectional view of semiconductor elements 10, 12 that can be directly bonded to one another, according to an embodiment. Unless otherwise noted, the components of FIG. 2 may be the same as or generally similar to like-numbered components of FIG. 1. Unlike the elements 10, 12 of FIG. 1, the bonding surface 18 and/or bonding layer 16 can be modified to provide a different functionality for the bonded structure. For example, the bonding layers 16 can include at least one omitted pad region including, e.g., a fully omitted pad region 32 that is devoid of a contact pad, and/or at least one partially-omitted pad region 33. The fully omitted pad regions 32 can comprise voids 26, and the partially-omitted pad regions 33 can comprise partial voids 28 and a remaining pad portion 29. Each of such voids 26, 28 can be filled with nonconductive material such as a gas, e.g., air, or filled with a solid nonconductive material (such as a solid dielectric material like silicon oxide). The remaining pad portions 29 may be present in the partially-omitted pad regions 33.

In order to enable the customization of bonded systems and to alter or fix the functionalities discussed herein, in one embodiment, one or more of the conductive contact pads 22 can be at least partially removed, as shown, e.g., in the fully omitted pad regions 32 (which may comprise fully removed pads 22) and/or the partially omitted pad regions 33. By the at least partial removal of the one or more conductive contact pads 22, one or more functionalities of the bonded structure 1 may be affected or even disabled.

For example, the removal of the one or more conductive contact pads 22 may correct a problem with the conductive contact pads 22, and/or the bonding interface 34 (shown in FIGS. 3A-3D and 6A-6D), etc., which may be performed at the foundry. Additionally or alternatively, the conductive contact pads 22 may be altered at a later stage to perform "dip switch" type programming to set chip parameters and/or to modify the functionality of the bonded structure. Such a modification in the functionality can serve as a hard programming process which can be performed at the foundry to set chip function before singulation, at the facility at which the elements 10, 12 are bonded, at a test facility to leverage the test results to set the dip switch settings, or at any other suitable location or step in the assembly or manufacturing process. As one example, such a modification in the functionality can be useful for various contexts of post-fabrication tailoring of integrated devices (such as, e.g., in a field-programmable gate array (FPGA)), which may currently utilize fuses, antifuses, or resistor trimming for configuration. As another example, such a modification in the functionality can allow defective parts to be salvaged, based on the test results. That is, for example, an operational speed of a processor can be set based on performance testing, or defective or shorted subcircuits can be turned off by such a modification.

The one or more conductive contact pads 22 that are to be omitted (either partially or fully) can be at least partially removed by masking and patterning with photoresist and wet etching of the conductive contact pads 22, which can be partially or completely removed from the bonding surface 18. In some embodiments, direct laser write lithography with a prescribed level of accuracy (e.g., under 1 micron line width, such as for example 300 nm line width) can be used, which can allow for pattering without use of masks.

Thus, in the embodiment of FIG. 2, one or more conductive contact pads 22 can be at least partially removed from or altered on the first element 10 and/or the second element 12 after initial formation. For example, the conductive contact pads 22 can be formed according to a prescribed pattern on the first element 10 or the second element 12. Trenches or openings can be formed in the bonding layers 16, and a barrier layer (e.g., a metallic or dielectric barrier layer) can be provided to line the openings. A seed layer can be provided over the barrier layer, and the conductive material for the contact pads 22 can be provided in the openings. A material removal process, such as chemical mechanical polishing (CMP), may be performed to remove overburden (not shown) on the conductive contact pads 22, and to generally establish the bonding surface 18. Subsequently, one or more conductive contact pads 22 can be selectively reduced or removed to prevent interconnections for these conductive contact pads 22 between the first element 10 and the second element 12. This process may be customized on a die-by-die basis or on a wafer location-by-wafer location basis in order to customize the functionality of the final bonded structures 1.

The bonding surface 18 can be prepared for direct bonding (e.g., by removal of barrier material such as metal from the bonding surface 18 and by planarization), and the parameters for the conductive contact pads 22 (e.g., recess depth) can be set for performing the hybrid direct bonding. As described herein, the fully omitted pad regions 32 and/or the partially-omitted pad regions 33 resulting from the previous steps can be filled with a gas, e.g., air, or with a solid nonconductive material (such as a solid dielectric material like silicon oxide). The remaining portions 29 of the conductive contact pads 22 may be present in the partially-omitted pad regions 33.

The bonding of the bonding surfaces 18 between the first element 10 and the second element 12 can be achieved by using wafer-to-wafer, die-to-die, or die-to-wafer hybrid bonding techniques, such that interconnections are disabled in the locations corresponding to the omitted pad regions 32 and/or the partially-omitted pad regions 33 between the first element 10 and the second element 12. The hybrid bonding between the first element 10 and the second element 12 may involve two chips (e.g., two integrated device dies) or a chip and a wafer. For example, for a die-to-wafer implementation, a single die type can have varied functionalities set by implementing the connection variation described above on the host wafer, achieved by partially or fully removing or omitting one or more conductive contact pads 22 on the wafer. On the other hand, a single host wafer type could have varied functionalities set by implementing the connection variation described above on the die, achieved by partially or fully removing or omitting one or more conductive contact pads 22 on a select die.

FIGS. 3A-3D are schematic side sectional views of various arrangements of bonded structures. As shown, and as described in detail below, the first element 10 and the second element 12 (shown in, e.g., FIGS. 1 and 2) can be directly bonded together without an intervening adhesive to form a bonded structure 1, which includes a bonding interface 34 formed by the bonding surfaces 18 of the first element 10 and the second element 12.

Figure 3A:
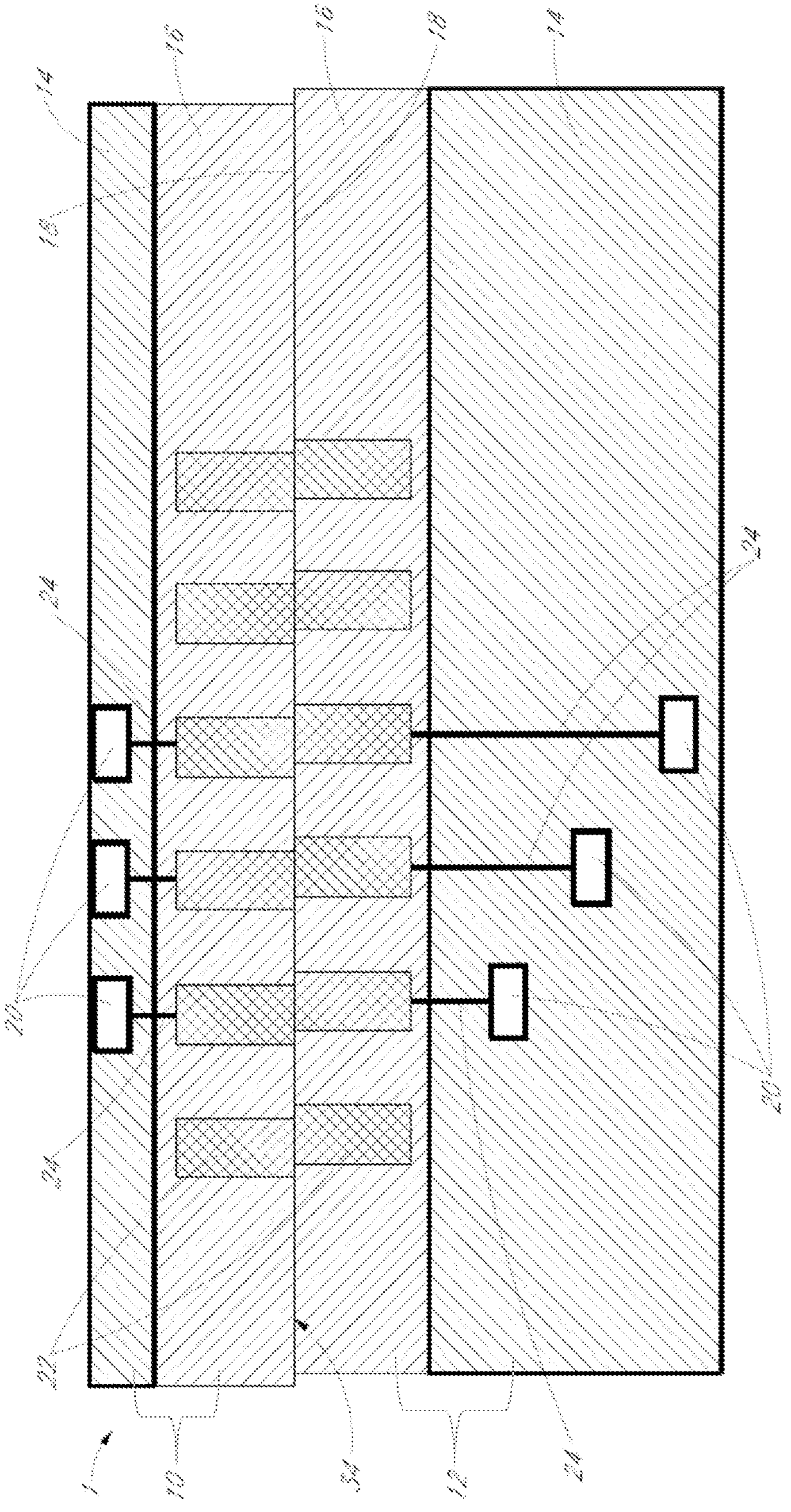
FIGS. 3A-3D are schematic side sectional views of various arrangements of bonded structures including two directly bonded semiconductor elements.

FIG. 3A illustrates a bonded structure 1 that includes the first element 10 and the second element 12 of FIG. 1 having no omitted pad region 32 or partially-omitted pad region 33. Thus, all of the interconnections between the pads 22 of the first element 10 and the second element 12 are provided, without any functionality being modified or disabled.

Figure 3B:
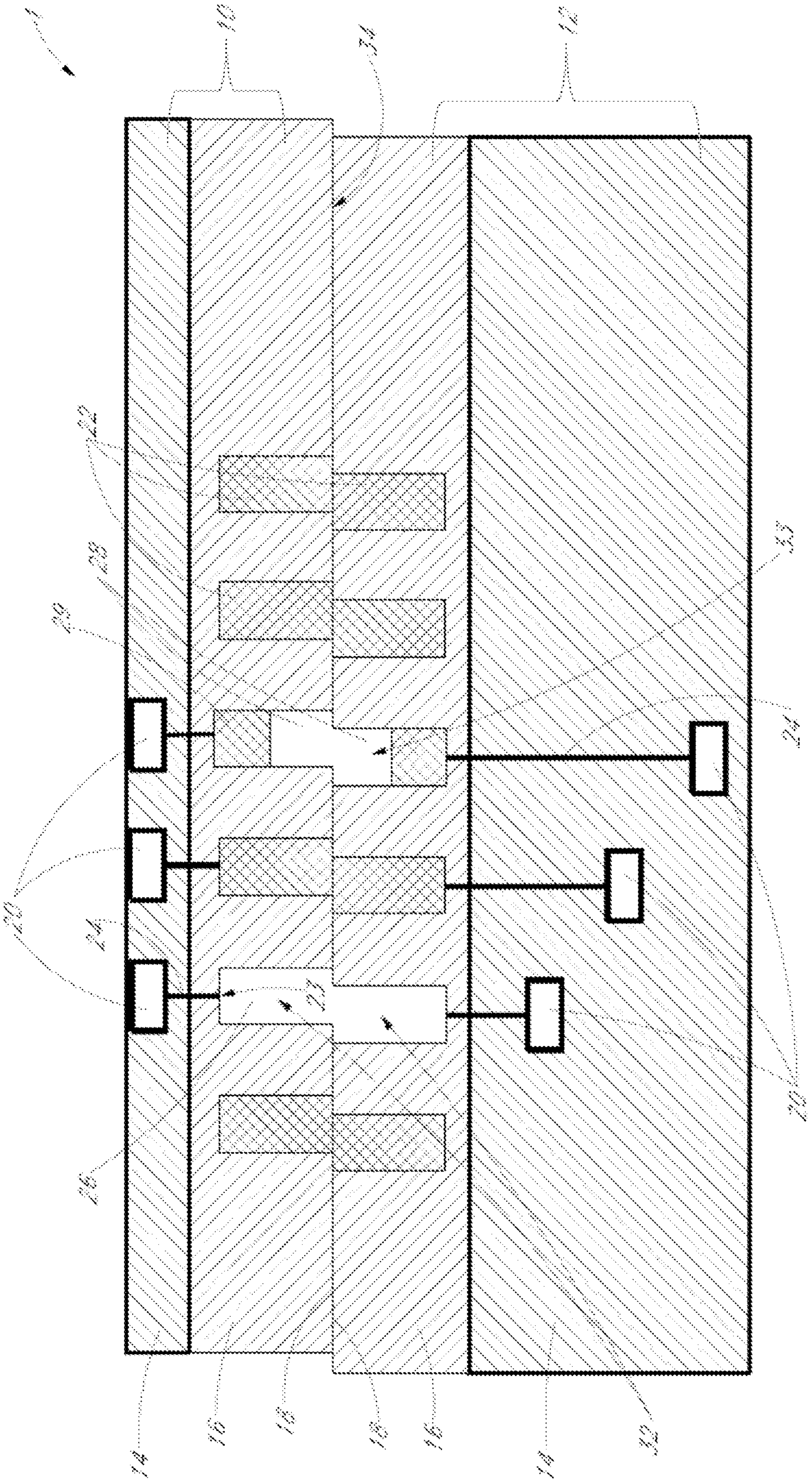
Figure 3C:
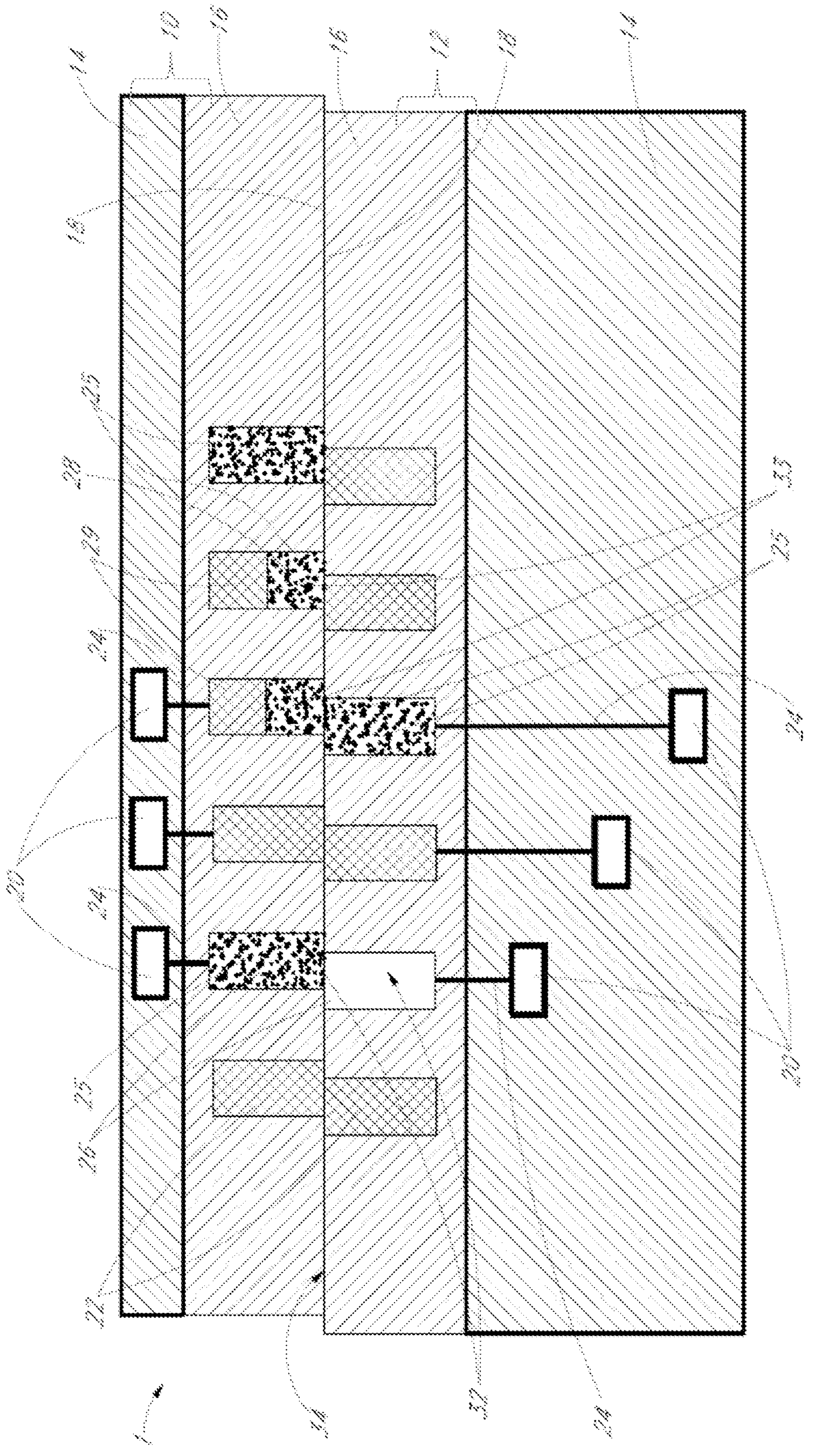
Figure 3D:
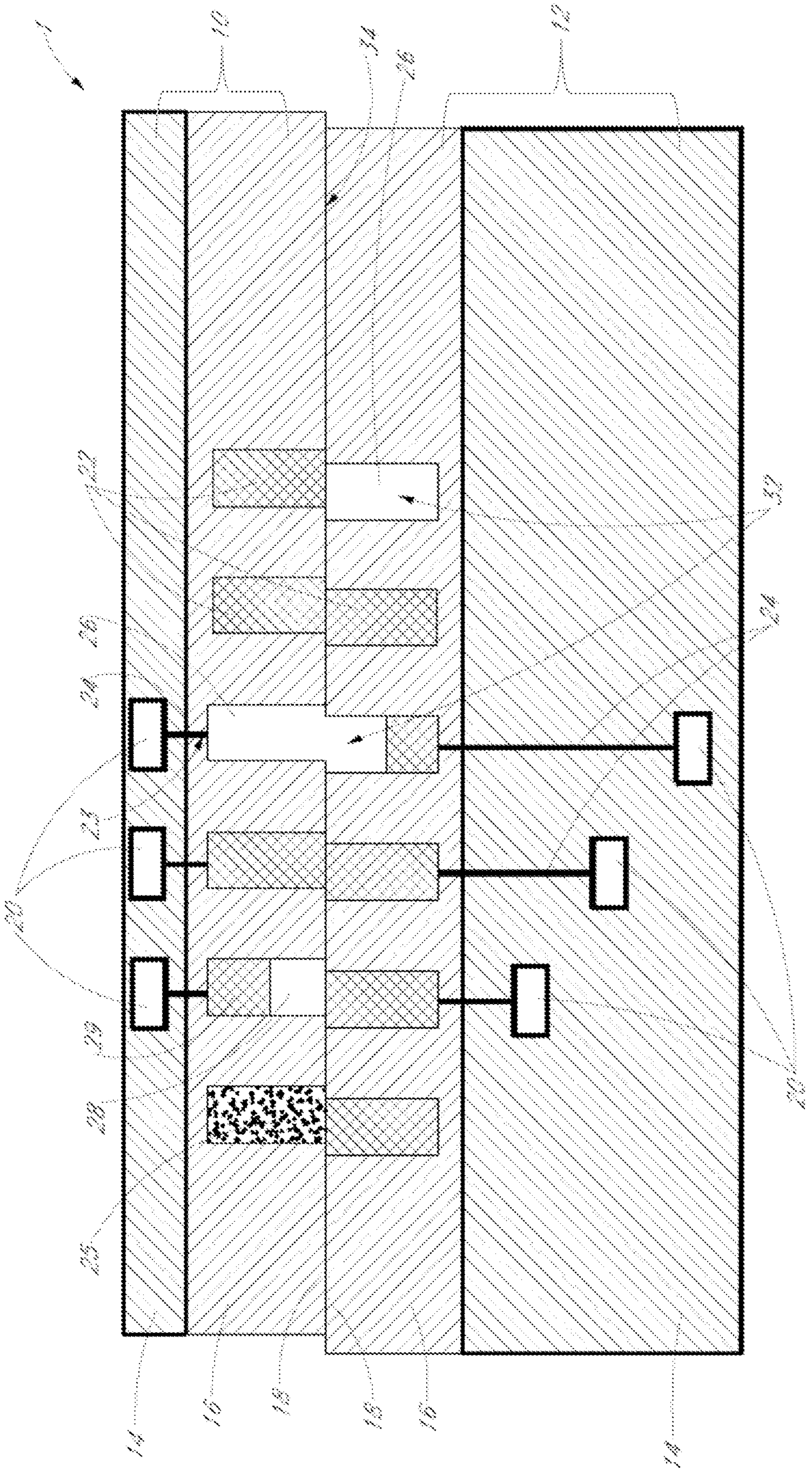

By contrast, FIG. 3B-3D illustrate bonded structures having various combinations of the omitted pad regions 32 and/or the partially-omitted pad regions 33 on the first element 10 and/or the second element 12. In these embodiments, the interconnections between the first element 10 and the second element 12 would be unavailable in the locations corresponding to the omitted pad regions 32 and/or the partially-omitted pad regions 33, which would alter or disable one or more functionalities in the bonded structure.

For example, in FIG. 3B, the bonding layers 16 can include fully omitted pad regions 32 and partially-omitted pad regions 33. In the directly bonded structure 1, the voids 26, 29 can remain filled with a gas (e.g., air) without a solid filling material. The voids 26, 28 of the opposing elements 10, 12 can align with one another and may remain in the bonded structure as gas-filled voids 26, 28. The presence of a nonconductive filling gas in the fully omitted and partially-omitted regions 32, 33 can prevent electrical connection between opposing integrated circuits 20 in the elements 10, 12. As shown in FIG. 3B, remaining pad portions 29 in the partially-omitted pad regions 33 can be spaced apart by the voids 28 in the bonded structure 1 so as to electrically separate the opposing remaining pad portions 29. In the fully omitted pad regions 32, terminating ends 23 of opposing traces 24 can be electrically separated from one another by the gas-filled voids 26. As explained above, it should be appreciated that, in some embodiments, the terminating ends 23 of the traces 24 can comprise a die bond pad (not shown) of the element 10 or 12. In other embodiments, the terminating ends 23 of the traces 24 can comprise a conductive extension into the bonding layer 16 that connects to the contact pads 22 before at least partial removal of the pads 22. For example, as explained above, an RDL or other metallization can extend laterally and/or vertically into the bonding layer 16 to connect to the pads 22 before at least partial removal. Thus, as shown, for contact pads that have been omitted (e.g., fully or partially omitted), the associated traces 24 can extend between the integrated circuit 20 (an example of a microelectronic device) and an omitted contact pad region (e.g., a fully omitted region 32 or a partially-omitted region 33).

The bonded structure of FIG. 3C includes fully and partially-omitted pad regions 32, 33 with voids 26, 28 that oppose one another as in FIG. 3B. FIG. 3C further illustrates a solid filling material 25 in which a solid nonconductive material (such as a solid dielectric material, such as silicon oxide) is provided in opposing voids 26, 28. The solid filling material 25 can be provided over remaining pad portion(s) 29 in partially-omitted pad regions 33. In some arrangements, the solid filling material 25 can be provided over the terminating ends 23 of traces 24 that terminate at voids 26 in omitted pad regions 32. Because the solid filling material 25 can be provided after at least partial removal of selected pads, an interface may be present between the solid filling material 25 and the surrounding nonconductive material of the bonding layer 16. In some embodiments, omitted pad regions 32 or 33 may be provided in the bonding layers 16 of both the first and second elements 10, 12. In some embodiments, omitted pad regions 32 or 33 may be provided on only one side of the bonding interface 34, e.g., in only the bonding layer 16 of either the first or second element 10, 12. FIG. 3D illustrates additional combinations of arrangements of fully omitted and partially-omitted pad regions 32, 33 in the first and/or second elements 10, 12. As shown, in some arrangements, the filling material 25 can be provided in the bonding layer 16 of one element 10, which can oppose unmodified contact pad 22 in opposing element 12. In some regions, a partially-removed pad portion 32 can comprise a void 28 adjacent unmodified contact pad 22. In some regions, partially-removed pad portions 33 can oppose fully-removed pad portions 32 such that voids 26, 28 are disposed adjacent one another. In some regions, voids 26 from fully-omitted pad regions 32 can be disposed adjacent the conductive material of unmodified contact pads 22. Skilled artisans will understand that other combinations of opposing modified pad regions may be suitable.

Thus, in FIGS. 3B-3D, selected contact pads 22 can be modified to disrupt electrical connections between the first and second elements 10, 12 so as to selectively prevent electrical communication between integrated circuits 20 that are connected to those selected contact pads 22. In various regions, gas voids may electrically separate a remaining pad portion 29 from a terminating end 23 of a trace 24 (in the case of a partially-removed pad portion 33 and an opposing fully-removed pad portion 32), two remaining pad portions (in the case of two opposing partially-removed pad portions 33), and/or two terminating ends 23 of opposing traces 24 (in the case of two opposing fully-removed pad portions 32). In various regions, the solid filling material 25 can be provided in the voids 26, 28 so as to separate a remaining pad portion from a terminating end 23 of a trace 24, two remaining pad portions 29, two terminating ends 23 of opposing traces, and/or gas voids disposed over a remaining pad portion 29 or terminating end 23 of a trace 24.

Beneficially, as explained above, modification of the bonding layer 16 and contact pads 22 can be used to modify the functionality of the bonded structure without having to redesign the chip pattern for the elements 10, 12. Accordingly, in some applications, the individual elements 10, 12 of FIGS. 3B-3D may be functionally similar or identical to the elements 10, 12 of FIG. 3A. For example, in some embodiments, the same types of chips can be used for the elements 10, 12 in FIGS. 3A-3D such that the underlying designs of the integrated circuits 20 are functionally the same. The overall functionality of the bonded structure can be altered by modifying the contact pads 22 as explained herein to selectively interrupt connectivity between selected opposing pads. As shown, even though the contact pads 22 may be fully or partially removed, the underlying traces 24 and integrated circuits 20 may remain unmodified. Thus, the partially or completely removed pads can be identified, for example, by the presence of traces 24 that extend from an integrated circuit 20 to an electrically inactive pad portion, such as a gas void 26, 28, a solid nonconductive filling material 25, or a remaining pad portion 29 that is electrically separated from the opposing pad on the opposing element. Traces 24 connected to disconnected circuits may accordingly dead-end at an inactive pad, an inactive remaining pad portion 29, or a nonconductive material (such as a gas void or filling material 25). It should be appreciated that, in any of the embodiments disclosed herein, for each element 10 or 12, all of the omitted pad regions can comprise fully omitted pad regions 32, all of the omitted pad regions can comprise partially omitted pad regions 33, or the omitted pad regions can comprise a mix of fully omitted pad regions 32 and partially-omitted pad regions 33. In some embodiments, the traces 24 that terminate at omitted pad regions 32, 33 may be electrically grounded so as to prevent a floating electrical contact.

Figure 4:
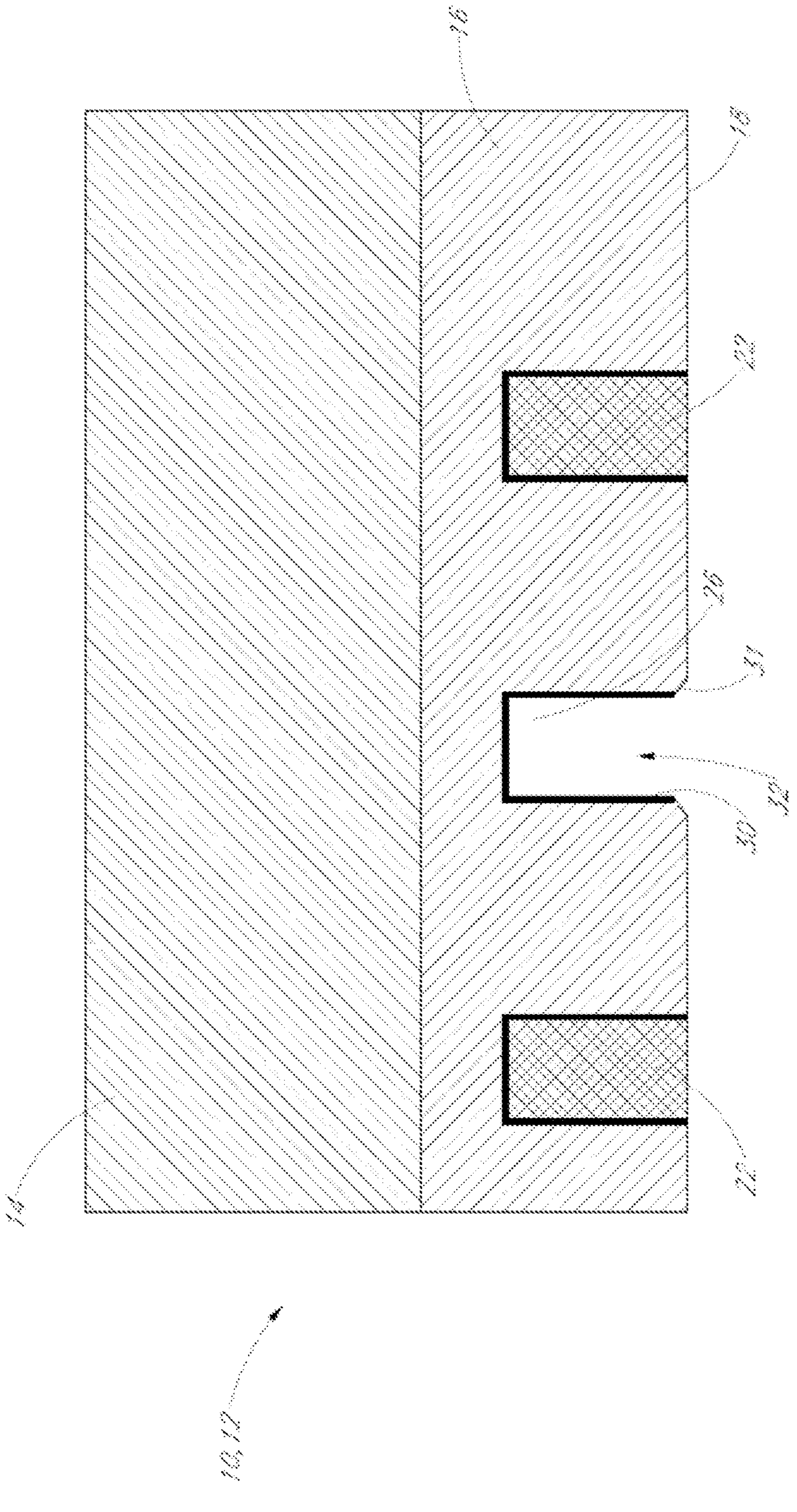
FIG. 4 is a schematic side sectional view of a portion of a semiconductor element, according to an embodiment.

FIG. 4 is a schematic side sectional view of a portion of a semiconductor element 10 or 12, according to an embodiment. For example, FIG. 4 illustrates an omitted pad region 32, which includes a barrier layer 30 and a rounded or angled surface 31 extending between the barrier layer 30 and the bonding surface 18. As explained above, the barrier layer 30 can be provided in the openings before the conductive material of the contact pads 22 are deposited. The barrier layer 30 can prevent diffusion of the conductive material of the conductive contact pads 22 (e.g., copper) into the non-conductive bonding layer 16 (made of, e.g., silicon oxide). The barrier layer 30 may comprise an electrically conductive layer, such as titanium nitride, tantalum nitride, etc.

In some arrangements, at least partial removal of the pads 22, for example, by etching, may leave at least a portion of the barrier layer 30 behind lining the bonding layer 16 within the void 26. In various embodiments, oxide and/or barrier edge rounding or other removal may be performed for the omitted pad regions 32 and/or the partially-omitted pad regions 33 to ensure that any remaining metal from the barrier layer 30 does not cause a short so as to electrically connect circuits that are intended to be electrically isolated. The barrier layer 30 may be removed at least at the bonding surface 18 by etching or may be removed as part of the preparation of the bonding surface 18 (e.g., by polishing), which may result in a rounding effect and removal of the barrier material at the bonding surface 18. The barrier-removal process may form a rounded or angled surface 31. The rounded or angled surface 31 may extend between a remaining portion of the barrier layer 30 within the void and the bonding surface 18. Beneficially, such oxide rounding may further prevent inadvertent interconnection through, e.g., the barrier layer 30, which is often conductive, in the omitted pad regions 32 and/or the partially-omitted pad regions 33 between the conductive contact pads 22 on opposing elements 10, 12.

Furthermore, for the fully omitted pad regions 32 and/or the partially-omitted pad regions 33 within the bonded structure 1, there may be conductive contact pads 22 which do not connect to any active circuitry. The disconnected or modified pads can be coupled to electrical ground in some embodiments, so as to not leave any of the conductive contact pads 22 corresponding to the omitted pad regions 32 and/or the partially-omitted pad regions 33 as electrically floating.

Figure 5A:
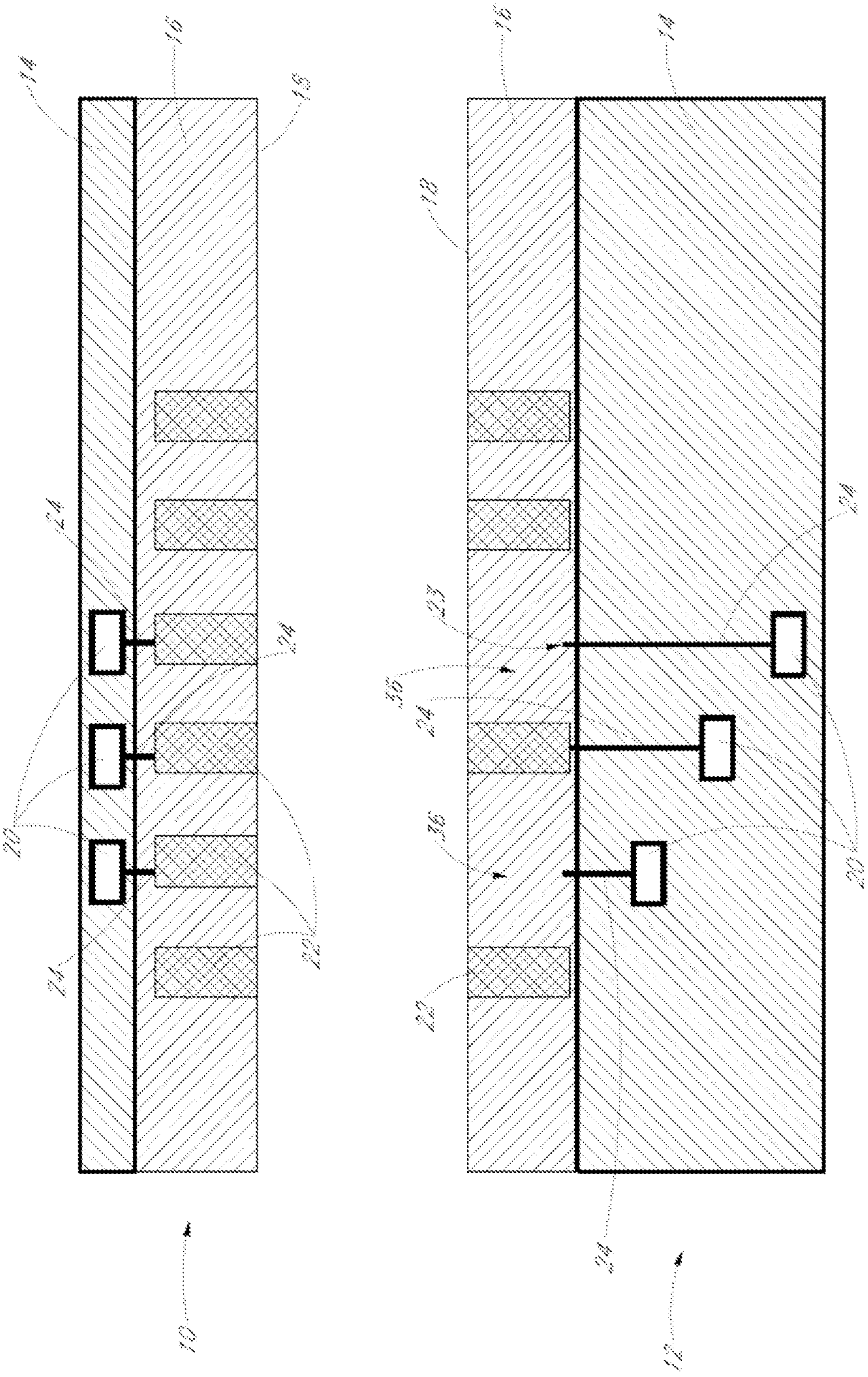
FIGS. 5A-5B are schematic side sectional views of semiconductor elements that can be directly bonded, according to an embodiment.
Figure 5B:
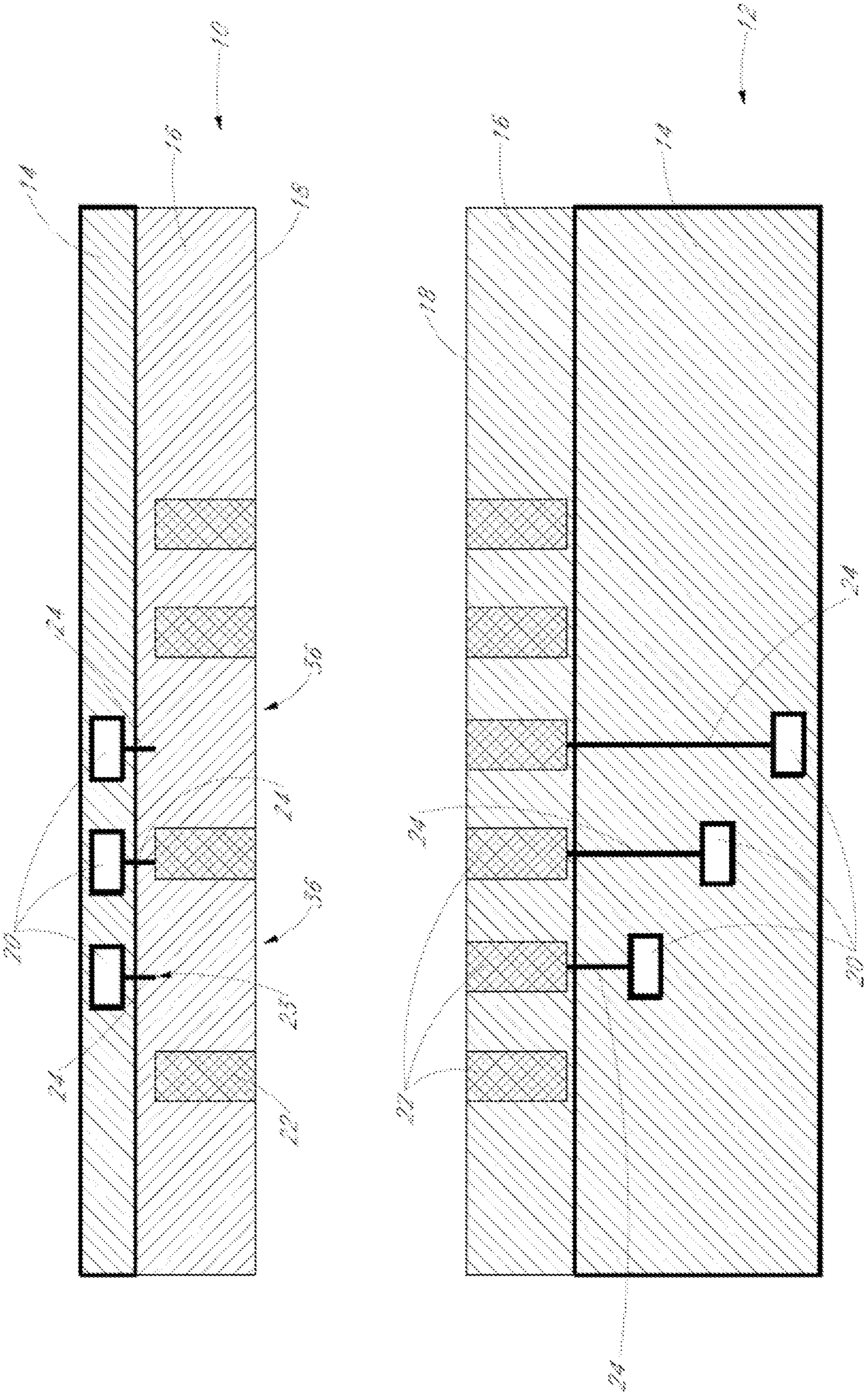

FIGS. 5A-5B are schematic side sectional views of semiconductor elements that can be directly bonded, according to another embodiment. Unless otherwise noted, components of FIGS. 5A-5B may be the same as or similar to like-numbered components of FIGS. 1-4. As with the embodiments of FIGS. 3B-3D, the elements 10, 12 can also include one or more omitted pad regions 36, which denote regions in which conductive contact pads 22 are not present (e.g., are omitted) from a pad layout pattern used for formation of the conductive contact pads 22. Unlike the embodiments of FIGS. 3B-3D, in which contact pads 22 are at least partially removed at selected interconnection locations, in FIGS. 5A-6D, element-to-element interconnections can be modified by altering the pattern of the contact pads such that disrupted interconnects can be provided by omitting pads from the bonding layer 16 during patterning. In such embodiments, pads need not be formed and then at least partially removed to form the omitted pad regions 36.

In one embodiment, the pad layout pattern used for the formation of the conductive contact pads 22 may be altered such that at least one conductive contact pad 22 is omitted from the pad layout pattern, resulting in the one or more regions 36 with missing conductive contact pads 22. The omitted pad regions 36 can be formed during masking and lithography, such that regions that would normally include contact pads instead comprise a nonconductive bonding material, such as silicon oxide. Thus, certain dies, chips, wafers, or portions thereof would have no conductive contact pads 22 formed in such locations corresponding to the one or more regions 36, so as to implement change in the functionality of the dies (or wafers), programming of the dies (or wafers), or otherwise alter the characteristics of the bonded structures 1. In this embodiment, the conductive contact pads 22 need not be altered once the hybrid interconnects are formed according to direct bonding techniques. In this embodiment, altering the functionality of a die, wafer, or portion thereof may be accomplished by altering the pattern of interconnects at the bonding interface 34 rather than changing the die or wafer itself. In other embodiments, some pads can be omitted by patterning, as shown in FIGS. 5A-5B, and portions of other contact pads 22 can be at least partially removed as explained in FIGS. 3B-3D if additional modification is desired.

In this embodiment, one or more conductive contact pads 22 can be omitted from formation on the first element 10 and/or the second element 12. For example, the layout of the conductive contact pads 22 may be customized on a die by die or wafer location by wafer location basis via altering the pad layout pattern used for the formation of the bonding layer 16 and conductive contact pads 22, in order to customize the final bonded products. A material removal process, such as CMP, may be performed to remove overburden (not shown) around the conductive contact pads 22 to be formed, and to establish the bonding surface 18. Subsequently, the bonding surface 18 can be finalized for bonding (e.g., by removal of barrier material such as metal from the bonding surface 18 comprising for example oxide), and the parameters for the conductive contact pads 22 (e.g., recess) can be set for performing the hybrid bonding.

FIGS. 6A-6D are schematic side sectional views of various embodiments of bonded structures including two directly bonded semiconductor elements. As shown, the first element 10 and the second element 12 can be directly bonded together to form a bonded structure 1, which includes a bonding interface 34 formed by the bonding surfaces 18 of the first element 10 and the second element 12.

Figure 6A:
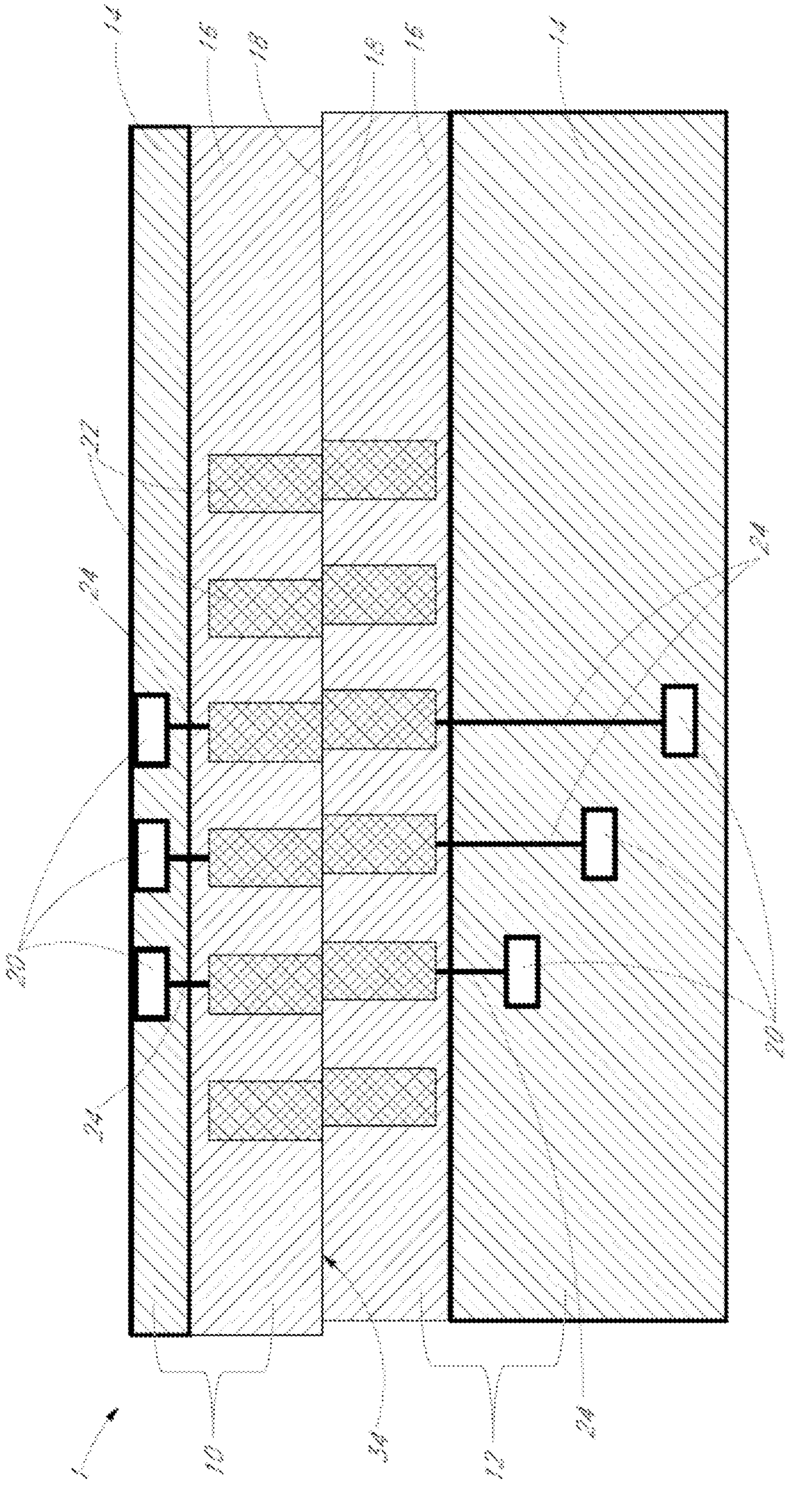
FIGS. 6A-6D are schematic side sectional views of various embodiments of bonded structures including two directly bonded semiconductor elements.

FIG. 6A shows an illustration of the first element 10 and the second element 12 having no omitted pad region 36. Thus, all of the interconnections between the first element 10 and the second element 12 would be available, without any functionality being affected or disabled.

Figure 6B:
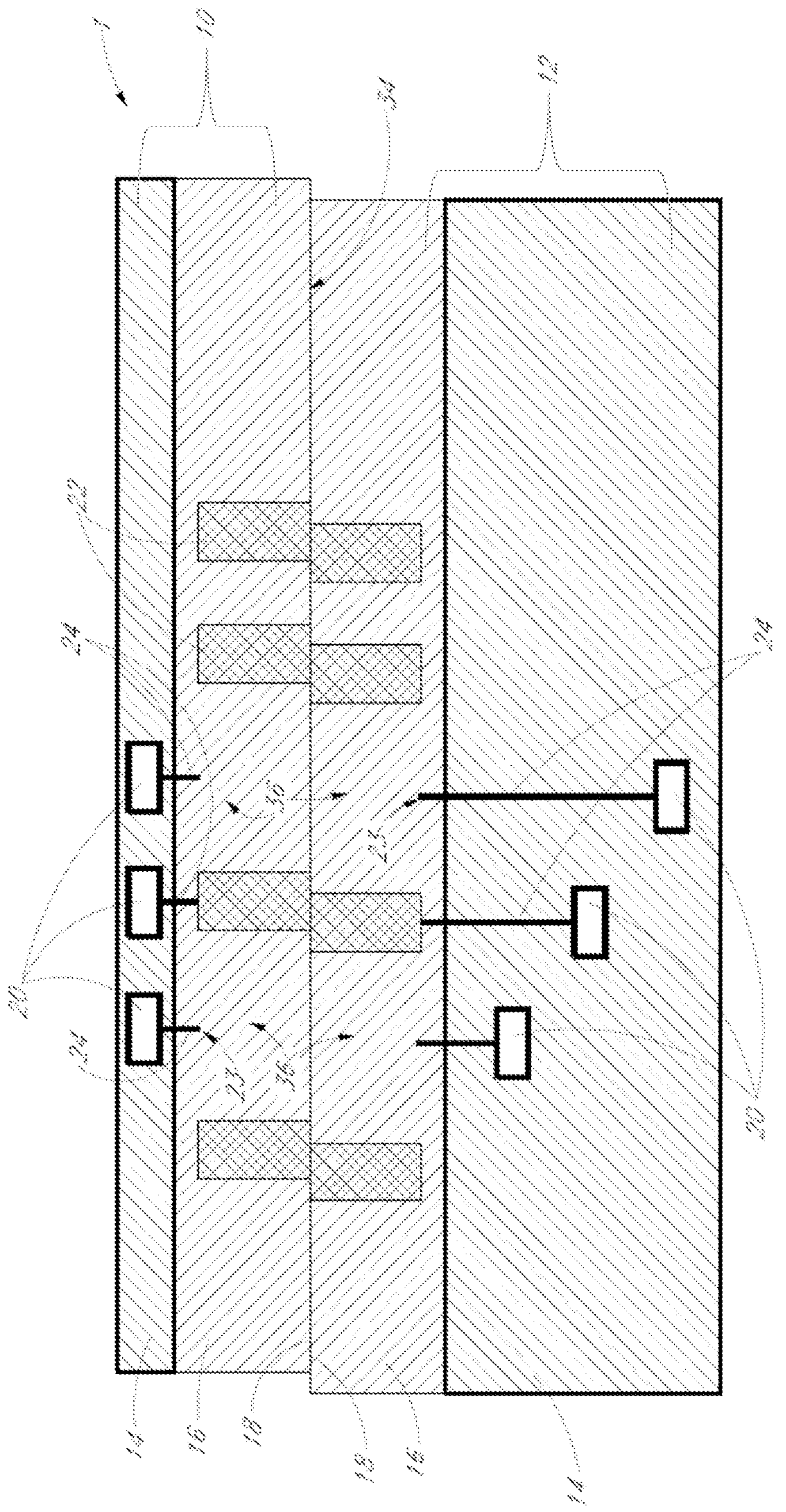
Figure 6C:
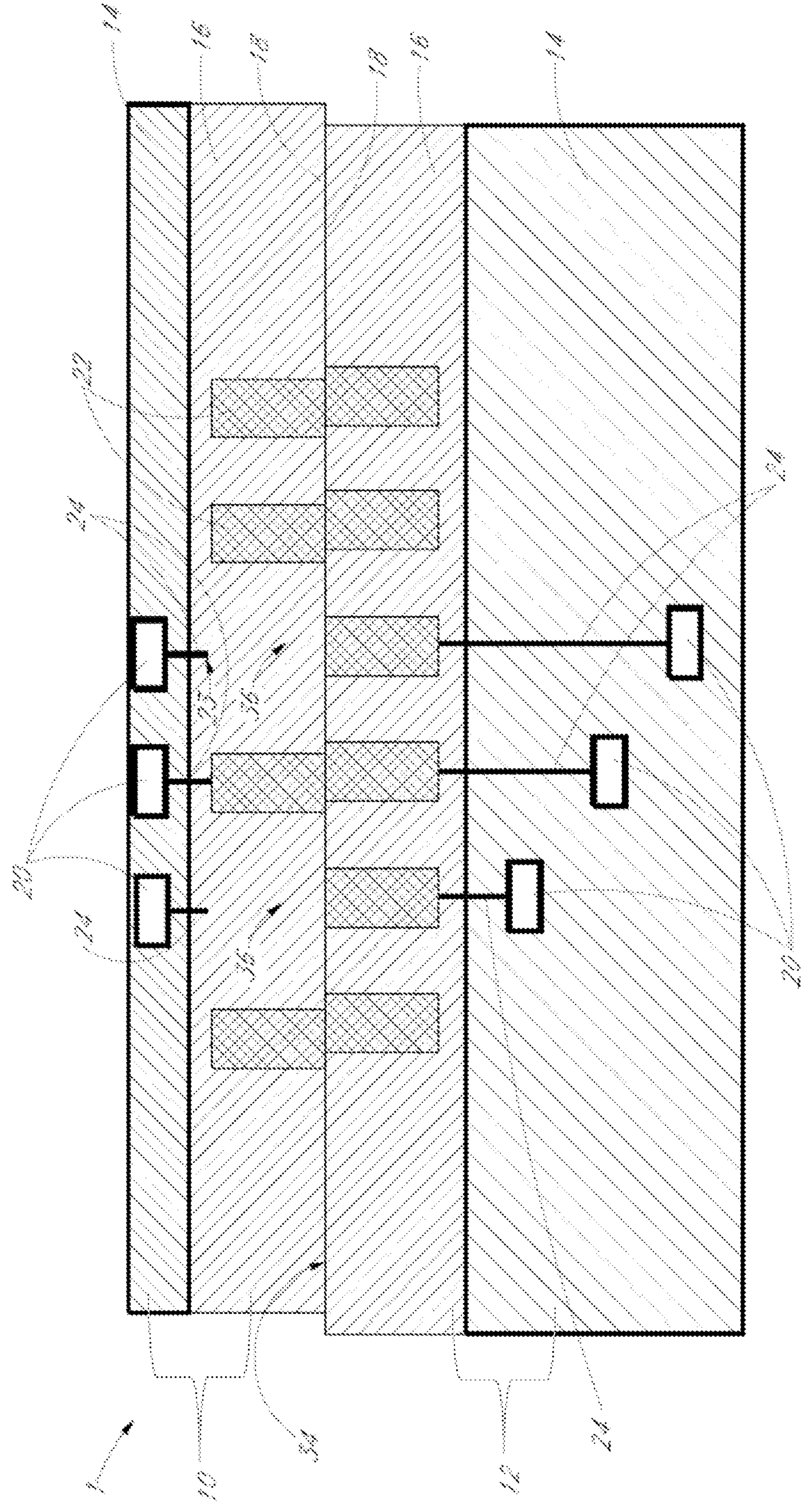
Figure 6D:
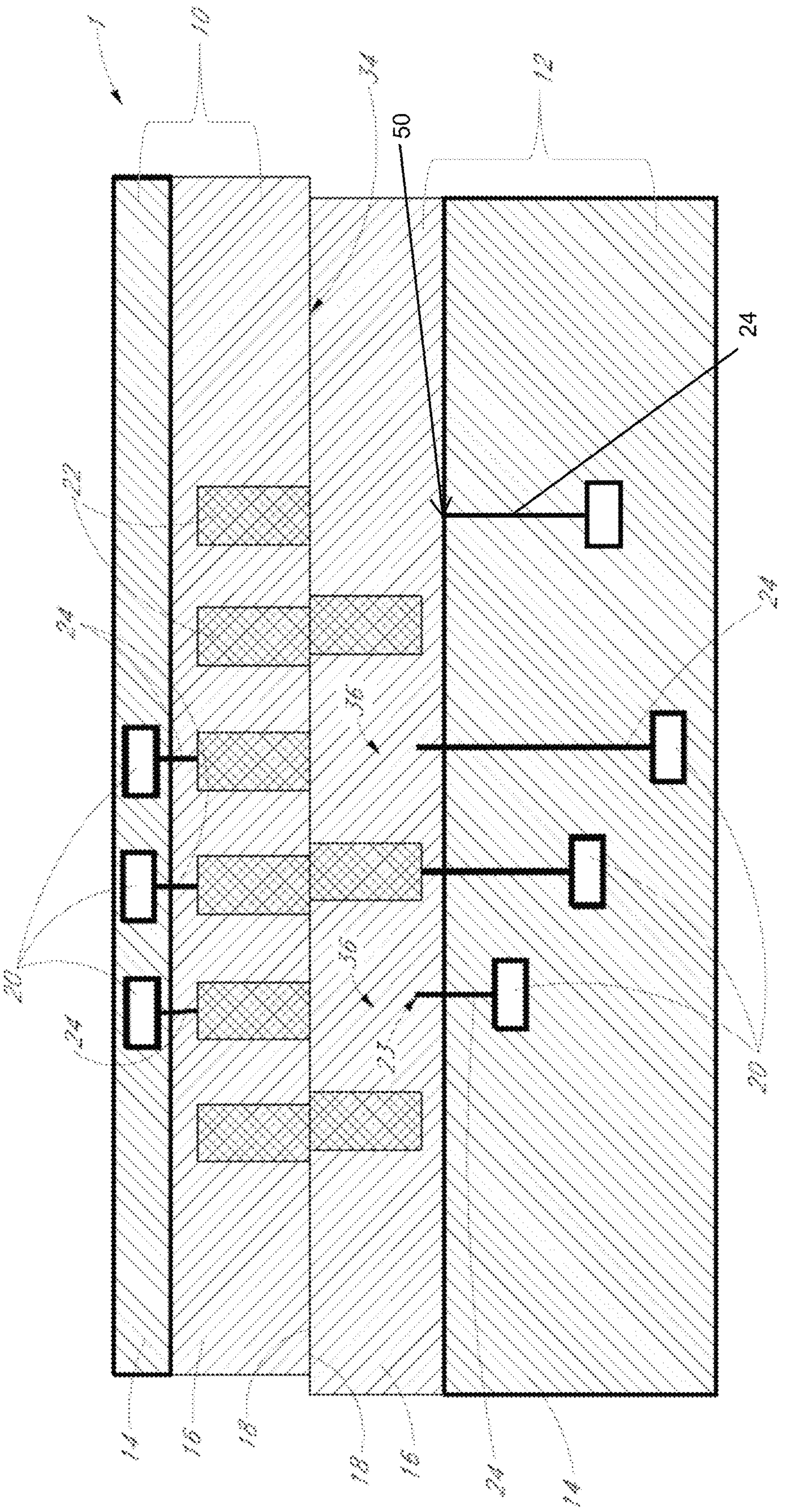

By contrast, FIG. 6B-6D illustrates various combinations of the omitted contact pad regions 36 on the first element 10 and/or the second element 12, denoting that the conductive contact pads 22 were not patterned and not formed in these regions 36. Instead of conductive pad material, the nonconductive bonding material of the bonding layer 16 (such as a solid dielectric, e.g., silicon oxide) can be provided the omitted contact pad regions 36. In these scenarios, the normally-connected interconnections between the first element 10 and the second element 12 would be unavailable in the locations corresponding to regions 36, which would alter or disable one or more functionalities, without modifying the separate elements 10, 12. As shown in FIGS. 6B-6D, the nonconductive material in the omitted pad regions 36 can extend between the device portions 14 of the respective elements 10, 12, or between the device portion 14 of one element 10, 12 and a contact pad 22 of the other element 10, 12. The nonconductive material within the omitted pad region 36 can therefore selectively electrically separate integrated circuits 20 on opposing elements 10, 12 that would normally, by original design, be electrically connected. As explained above, terminating ends 23 of traces 24 (which may include a die bond pad 50, a dangling end of a trace, or a trace extension or other metallization extending into the bonding layer 16), which would normally connect an integrated circuit 20 with an active contact pad 22, instead may terminate at the nonconductive material in the omitted contact pad region 36 such that no electrical connection is made between a selected integrated circuit 20 and an opposing contact pad and/or integrated circuit 20 on an opposing element.

Figure 7A:
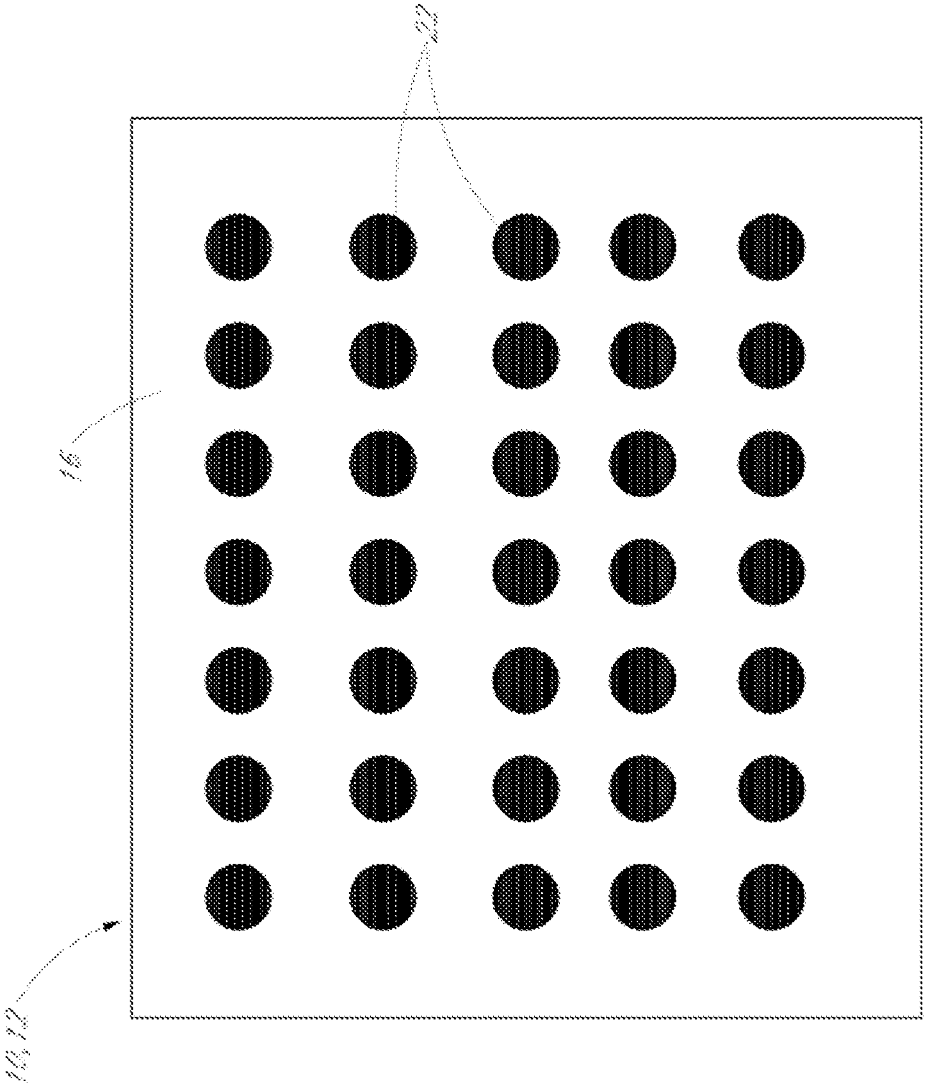
FIGS. 7A-7C are schematic bottom plan views of semiconductor elements having different contact pad patterns.
Figure 7B:
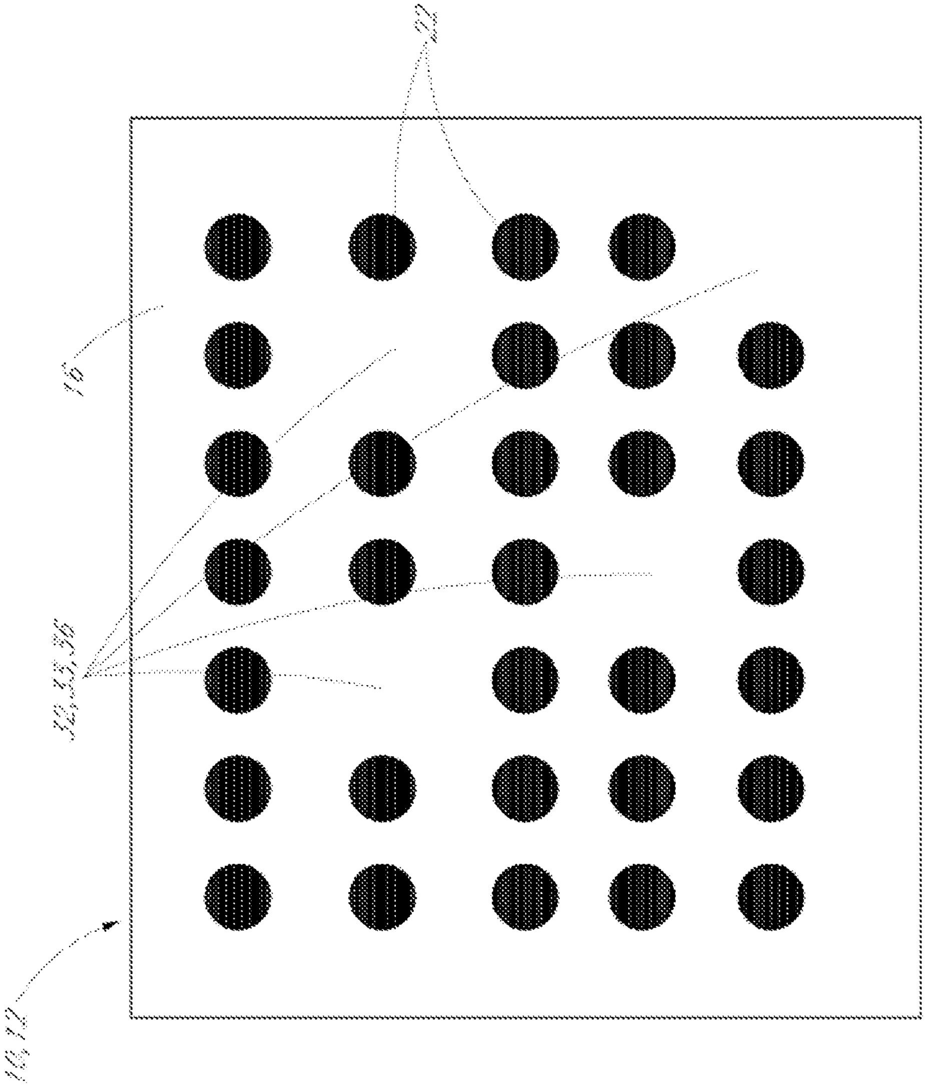
Figure 7C:
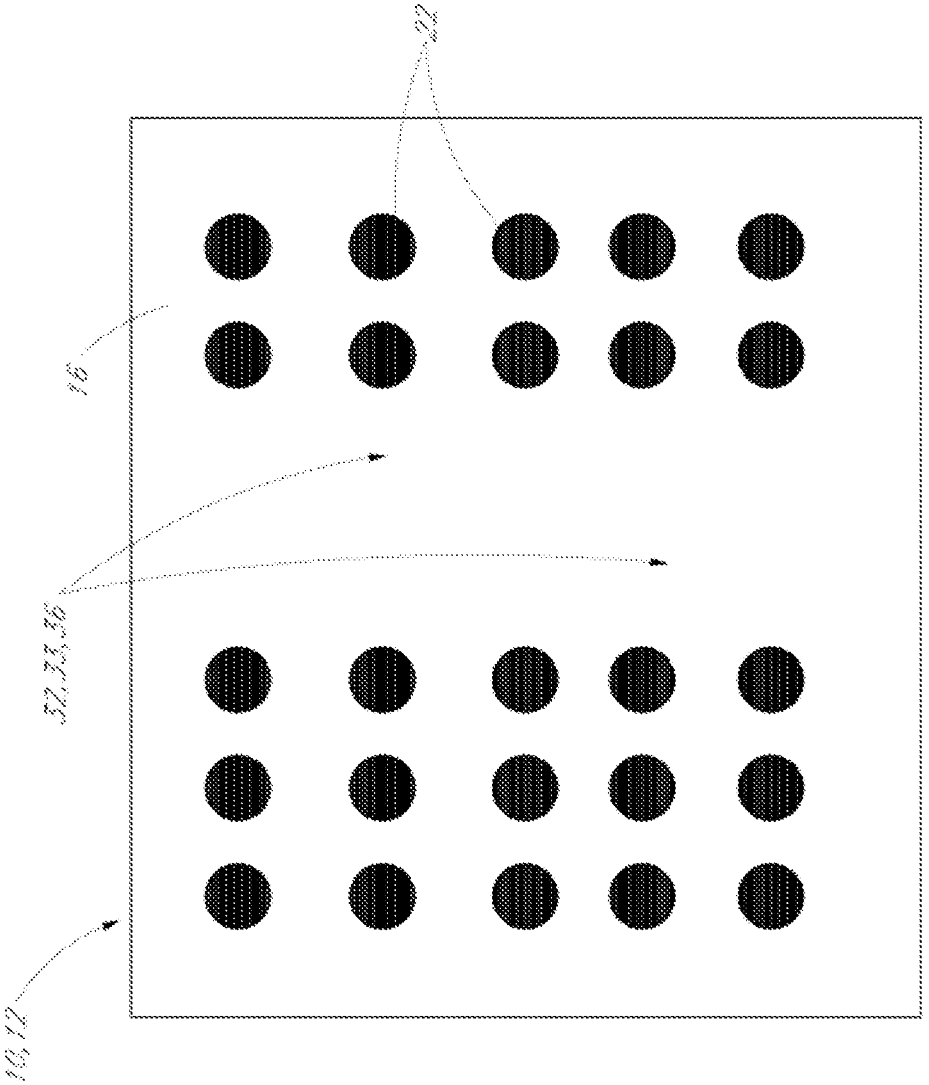

FIGS. 7A-7C are schematic bottom plan views of semiconductor elements 10, 12 having different contact pad patterns. FIG. 7A shows an element 10 or 12 that has contact pads 22 shown in a regular two-dimensional array. In FIG. 7A, no contact pads 22 are omitted (such as in FIGS. 3A and 6A) so that all available connections between the bonded elements 10, 12 are made. By contrast, FIGS. 7B and 7C show omitted contact pad regions 32, 33, 36, in which all or part of selected contact pads 22 may be omitted in selected locations of the elements 10, 12. For example, in FIG. 7B, the omitted contact pad regions 32, 33, 36 may be interspersed through the array to selectively disrupt electrical interconnection at specifically-identified contact pads 22. In FIG. 7C, the omitted contact pad regions 32, 33, 36 can comprise a plurality of rows of pads 22, e.g., in the central region of the element 10, 12. For example, in some embodiments, contact pads 22 within a common region may have similar functionality such that the functionality can be modified by omitting the contact pads within that region (e.g., the two rows shown in FIG. 7C). Skilled artisans would appreciate that many other patterns of omitted pads may be suitable. It should be appreciated that the omitted contact pad regions 32, 33, 36 can be provided in any part of the element 10, 12, to modify interconnections in specific isolated portion(s) of the element 10, 12 or to modify region(s) of the element 10, 12. Thus, the plurality of contact pads can be arranged in a regular pattern but for the one or more omitted contact pads, as seen from a bottom plan view.

Figure 8:
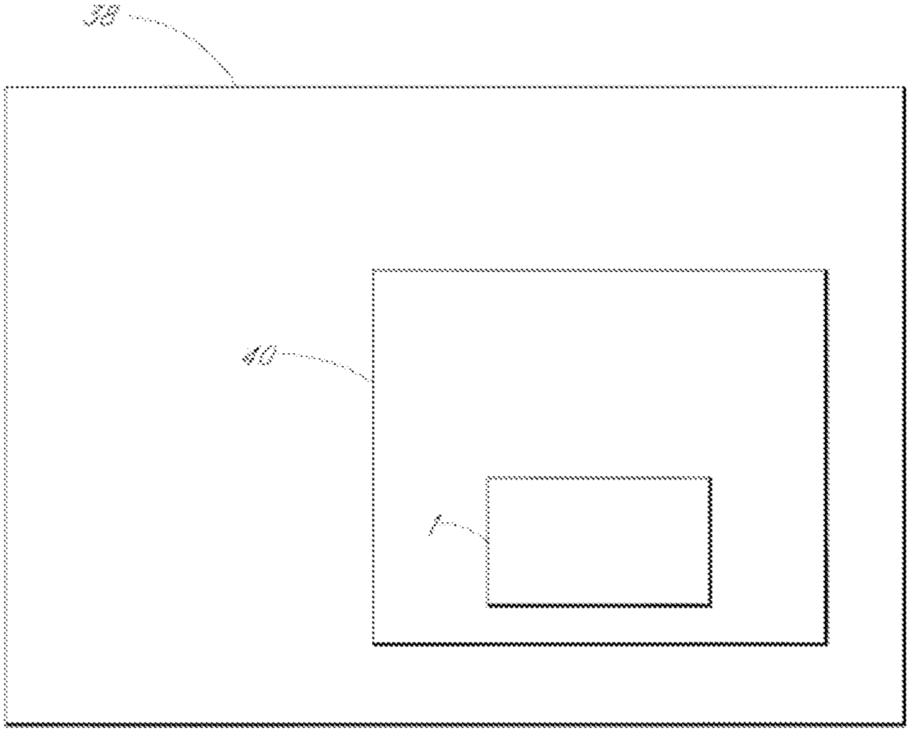
FIG. 8 is a schematic system diagram showing an electronic system that can include one or multiple bonded structures, according to various embodiments.

FIG. 8 is a schematic diagram of a system 38 incorporating one or more bonded structure 1, according to various embodiments. The system 38 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 40 which are mechanically and electrically connected to the system 38, e.g., by way of one or more motherboards. Each package 40 can comprise one or more bonded structures 1. The bonded structures 1 shown in FIG. 8 can comprise any of the bonded structure disclosed herein. The bonded structure 1 can include one or more integrated device dies which perform various functions for the system 38.

Examples of Direct Bonding and Directly Bonded Structures

Various embodiments disclosed herein relate to directly bonded structures in which two elements can be directly bonded to one another without an intervening adhesive. Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

In some embodiments, the elements are directly bonded to one another without an adhesive. In various embodiments, a non-conductive or dielectric material of a bonding layer of a first element can be directly bonded to a corresponding non-conductive or dielectric field region of a bonding layer of a second element without an adhesive. The non-conductive material can be referred to as a nonconductive bonding region or bonding layer of the first element. In some embodiments, the non-conductive material of the first element can be directly bonded to the corresponding non-conductive material of the second element using nonconductor-to-nonconductor (e.g., dielectric-to-dielectric) bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, direct hybrid bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBIR, techniques commercially available from Xperi of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less than 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. In one application, a width of the first element in the bonded structure is similar to a width of the second element. In some other embodiments, a width of the first element in the bonded structure is different from a width of the second element. Similarly, the width or area of the larger element in the bonded structure may be at least 10% larger than the width or are of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in U.S. Patent Application Publication No. 2019/0096741, which is incorporated by reference herein in its entirety and for all purposes.

Unless the context clearly requires otherwise, throughout the description and the claims, the words “comprise,” “comprising,” “include,” “including” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word “connected”, as generally used herein, refers to two or more elements that may be either directly connected, or connected by way of one or more intermediate elements. Additionally, the words “herein,” “above,” “below,” and words of similar import, when used in this application, shall refer to this application as a whole and not to any particular portions of this application. Moreover, as used herein, when a first element is described as being “on” or “over” a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word “or” in reference to a list of two or more items, that word covers all of the following interpretations of the word: any of the items in the list, all of the items in the list, and any combination of the items in the list.

Moreover, conditional language used herein, such as, among others, “can,” “could,” “might,” “may,” “e.g.,” “for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A bonded structure comprising:

a first element having a first bonding surface comprising a first nonconductive material and a plurality of first contact pads at least partially embedded in the first nonconductive material, the first contact pads electrically connected to one or more first microelectronic devices in the first element; and a second element having a second bonding surface comprising a second nonconductive material and a plurality of second contact pads at least partially embedded in the second nonconductive material, the second contact pads electrically connected to one or more second microelectronic devices in the second element, wherein the second bonding surface is directly bonded to the first bonding surface without an intervening adhesive to form a bonding interface, wherein the first element comprises an omitted contact pad region comprising an insulating material, wherein a trace terminating at the omitted contact pad region extends to at least one of the one or more first microelectronic devices, the trace being electrically isolated from any contact pad.

2. The bonded structure of claim 1, wherein the omitted contact pad region comprises one or more voids in the first nonconductive material.

3. The bonded structure of claim 1, wherein the insulating material of the omitted contact pad region comprises a solid nonconductive filler material disposed in the first nonconductive material and an interface is disposed between the solid nonconductive filler material and the first nonconductive material.

4. The bonded structure of claim 1, wherein the omitted contact pad region comprises a fully-omitted contact pad region devoid of a contact pad.

5. The bonded structure of claim 4, wherein the first nonconductive material extends continuously within the omitted contact pad region.

6. The bonded structure of claim 1, wherein the omitted contact pad region comprises a partially-omitted contact pad region including a remaining portion of one of the plurality of first contact pads and a void above the remaining portion.

7. The bonded structure of claim 6, further comprising a solid nonconductive filling material in the void.

8. The bonded structure of claim 1, wherein the plurality of first contact pads is directly bonded to the plurality of second contact pads, the bonded structure comprising a plurality of traces extending between the one or more first microelectronic devices and the plurality of first contact pads.

9. The bonded structure of claim 1, wherein the trace has a terminating end that terminates into the omitted contact pad region.

10. The bonded structure of claim 9, wherein the first element comprises a bulk semiconductor portion, the first nonconductive material disposed on the bulk semiconductor portion, the terminating end of the trace extending into the first nonconductive material.

11. The bonded structure of claim 1, wherein the trace is connected to an electrical ground.

12. The bonded structure of claim 1, wherein the second element comprises a second omitted contact pad region, and the second omitted contact pad region is aligned with the omitted contact pad region.

13. The bonded structure of claim 1, wherein the plurality of first contact pads is arranged in a regular pattern but for the omitted contact pad region, as seen from a bottom plan view.

14. The bonded structure of claim 1, wherein the omitted contact pad region comprises a barrier layer disposed in the first nonconductive material, a rounded or angled surface of the first nonconductive material extending between the barrier layer and the bonding interface.

15. A bonded structure comprising:

a first element having a first bonding surface comprising a first nonconductive material and a plurality of first contact pads at least partially embedded in the first nonconductive material, the first contact pads electrically connected to one or more first microelectronic devices in the first element by way of one or more traces of a plurality of first traces; and a second element having a second bonding surface comprising a second nonconductive material and a plurality of second contact pads at least partially embedded in the second nonconductive material, the second contact pads electrically connected to one or more second microelectronic devices in the second element by way of one or more second traces, wherein the second bonding surface is directly bonded to the first bonding surface without an intervening adhesive to form a bonding interface, and wherein at least one first trace of the plurality of first traces extends between at least one of the one or more first microelectronic devices and an omitted contact pad region at the bonding interface and is at least partially embedded in the first nonconductive material, the omitted contact pad region comprising an insulating material, wherein the at least one first trace terminates at the omitted contact pad region and is electrically isolated from any contact pad.

16. The bonded structure of claim 15, wherein the omitted contact pad region comprises one or more voids in the first nonconductive material.

17. The bonded structure of claim 16, wherein the insulating material of the omitted contact pad region comprises a solid nonconductive filler material disposed in the one or more voids, an interface disposed between the solid nonconductive filler material and the first nonconductive material.

18. The bonded structure of claim 15, wherein the omitted contact pad region comprises a fully-omitted contact pad region devoid of a contact pad.

19. The bonded structure of claim 18, wherein the first nonconductive material extends continuously within the omitted contact pad region.

20. The bonded structure of claim 1, wherein the trace terminates below the bonding interface.

21. The bonded structure of claim 15, wherein the at least one first trace terminates below the bonding interface.

* * * * *